(12) United States Patent
Wagner et al.

(10) Patent No.: US 10,321,598 B2
(45) Date of Patent: *Jun. 11, 2019

(54) APPARATUS AND METHOD FOR HOUSING ELECTRONIC EQUIPMENT AND INCREASING FLOOR SPACE UTILIZATION IN A SECURE ENVIRONMENT

(71) Applicant: BlackHawk Labs LLC, Sacramento, CA (US)

(72) Inventors: Tod A. Wagner, Granite Bay, CA (US); Richard F. Murphy, East Hampstead, NH (US)

(73) Assignee: BlackHawk Labs LLC, Sacramento, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/140,180

(22) Filed: Apr. 27, 2016

(65) Prior Publication Data

US 2016/0242310 A1 Aug. 18, 2016

Related U.S. Application Data

(63) Continuation of application No. 13/442,728, filed on Apr. 9, 2012, which is a continuation of application
(Continued)

(51) Int. Cl.
*H05K 7/14* (2006.01)
*H05K 7/18* (2006.01)
*H05K 7/20* (2006.01)

(52) U.S. Cl.
CPC ......... *H05K 7/1489* (2013.01); *H05K 7/1491* (2013.01); *H05K 7/1492* (2013.01);
(Continued)

(58) Field of Classification Search
CPC .......................... H05K 7/1485–7/1489; H05K 7/1491–7/1492; H05K 7/18–7/183;
(Continued)

(56) References Cited

U.S. PATENT DOCUMENTS

| | | | |
|---|---|---|---|
| 2,871,457 A | * | 1/1959 | Jencks ................. H05K 7/1407 174/50 |
| 3,197,731 A | | 7/1965 | Beale et al. |

(Continued)

FOREIGN PATENT DOCUMENTS

| | | | |
|---|---|---|---|
| WO | WO 98/24085 | * | 6/1998 |
| WO | WO-2008/134497 A1 | | 11/2008 |
| WO | WO-2008/134500 A2 | | 11/2008 |

OTHER PUBLICATIONS

"U.S. Appl. No. 12/109,212, Appeal Brief filed Dec. 21, 2012", 16 pgs.
(Continued)

*Primary Examiner* — Zachary Pape
(74) *Attorney, Agent, or Firm* — Schwegman Lundberg & Woessner, P.A.

(57) ABSTRACT

A secure electronic equipment rack allows electronic equipment to be hung vertically to save space for deep components. This is done by providing a vertical rack apparatus with horizontal side panels on which components are mounted vertically. The side panels of the rack are shorter than the depth of the components to be mounted on, to, or within the panels, thus allowing space to be saved, The rack can be expanded based on user's equipment growth. The apparatus can be mounted on a wall or on a standard EIA relay rack. The apparatus has cable management for equipment that fits into wire channels and allows having a patch panel mounted without taking up a "U" space in the apparatus itself, The apparatus can include a built-in level for ease of mounting, and an integrated earth grounding stud. A
(Continued)

secure version can include tamper resistance by adding baffling of ventilation areas, for example in both top and bottom vent patterns, and can be designed to be assembled in an overlapping fashion which allows no exposed hardware with the last piece to be assembled being the first to be removed in sequence.

27 Claims, 20 Drawing Sheets

Related U.S. Application Data

No. 12/109,228, filed on Apr. 24, 2008, now Pat. No. 8,152,000.

(60) Provisional application No. 60/926,384, filed on Apr. 26, 2007.

(52) U.S. Cl.
CPC ............ *H05K 7/18* (2013.01); *H05K 7/20718* (2013.01); *H05K 7/20836* (2013.01); *H05K 7/20554* (2013.01); *H05K 7/20563* (2013.01); *H05K 7/20736* (2013.01)

(58) Field of Classification Search
CPC ........... H05K 7/20718; H05K 7/20836; H05K 7/20554; H05K 7/20563; H05K 7/20736
USPC ...................... 361/679.02, 724–727; 454/184
See application file for complete search history.

(56) References Cited

U.S. PATENT DOCUMENTS

| | | | |
|---|---|---|---|
| 4,826,115 A | 5/1989 | Novitski | |
| 5,372,262 A | 12/1994 | Benson et al. | |
| 6,403,885 B1* | 6/2002 | Baker, III | H02B 1/202 138/111 |
| 6,525,930 B1 | 2/2003 | Rumney | |
| 6,654,255 B2 | 11/2003 | Kruse et al. | |
| 6,669,029 B1 | 12/2003 | Beane | |
| 6,698,079 B1* | 3/2004 | Mimlitch, III | H05K 7/1425 211/41.17 |
| 6,736,277 B2 | 5/2004 | Lauchner et al. | |
| 6,920,049 B2 | 7/2005 | Brooks et al. | |
| 7,033,267 B2 | 4/2006 | Rasmussen | |
| 7,312,990 B2 | 12/2007 | Mangold | |
| 7,498,512 B2* | 3/2009 | Adducci | H02B 1/202 174/50 |
| 8,152,000 B2* | 4/2012 | Wagner | H05K 7/1489 211/26 |
| 2002/0190011 A1 | 12/2002 | Caporale | |
| 2003/0039094 A1 | 2/2003 | Sarkinen et al. | |
| 2003/0112596 A1 | 6/2003 | Shih | |
| 2003/0227772 A1 | 12/2003 | Yoshida et al. | |
| 2003/0235035 A1* | 12/2003 | Wintersteen | H05K 7/20736 361/679.49 |
| 2004/0047115 A1 | 3/2004 | Helot et al. | |
| 2004/0165358 A1 | 8/2004 | Regimbal et al. | |
| 2005/0072745 A1 | 4/2005 | Schmidtk et al. | |
| 2005/0218091 A1 | 10/2005 | Westphall | |
| 2005/0280986 A1 | 12/2005 | Coglitore et al. | |
| 2006/0034046 A1 | 2/2006 | Chen et al. | |
| 2006/0141921 A1 | 6/2006 | Turek et al. | |
| 2008/0264880 A1 | 10/2008 | Wagner et al. | |
| 2008/0290052 A1 | 11/2008 | Wagner et al. | |
| 2012/0193308 A1 | 8/2012 | Wagner et al. | |

OTHER PUBLICATIONS

"U.S. Appl. No. 12/109,212, Advisory Action dated Jul. 23, 2010", 3 pgs.
"U.S. Appl. No. 12/109,212, Appeal Decision dated Aug. 14, 2015", 10 pgs.
"U.S. Appl. No. 12/109,212, Examiner Interview Summary dated Mar. 30, 2011", 3 pgs.
"U.S. Appl. No. 12/109,212, Examiner Interview Summary dated Jul. 19, 2010", 3 pgs.
"U.S. Appl. No. 12/109,212, Examiner's Answer to Appeal Brief dated Mar. 13, 2013", 8 pgs.
"U.S. Appl. No. 12/109,212, Final Office Action dated May 4, 2010", 12 pgs.
"U.S. Appl. No. 12/109,212, Final Office Action dated May 18, 2011", 18 pgs.
"U.S. Appl. No. 12/109,212, Final Office Action dated Jul. 24, 2012", 15 pgs.
"U.S. Appl. No. 12/109,212, Non Final Office Action dated Nov. 6, 2009", 12 pgs.
"U.S. Appl. No. 12/109,212, Non Final Office Action dated Nov. 10, 2010", 23 pgs.
"U.S. Appl. No. 12/109,212, Non Final Office Action dated Nov. 27, 2015", 21 pgs.
"U.S. Appl. No. 12/109,212, Non Final Office Action dated Dec. 5, 2011", 19 pgs.
"U.S. Appl. No. 12/109,212, Reply Brief filed May 13, 2013", 5 pgs.
"U.S. Appl. No. 12/109,212, Response filed Mar. 8, 2010 to Non Final Office Action dated Nov. 6, 2009", 12 pgs.
"U.S. Appl. No. 12/109,212, Response filed Apr. 11, 2011 to Non Final Office Action dated Nov. 10, 2010", 15 pgs.
"U.S. Appl. No. 12/109,212, Response filed May 7, 2012 to Non Final Office Action dated Dec. 5, 2011", 7 pgs.
"U.S. Appl. No. 12/109,212, Response filed Jul. 6, 2010 to Final Office Action dated May 4, 2010", 15 pgs.
"U.S. Appl. No. 12/109,212, Response filed Jul. 13, 2012 to Restriction Requirement dated Jun. 13, 2012", 8 pgs.
"U.S. Appl. No. 12/109,212, Response filed Sep. 7, 2010 to Non Final Office Action dated May 4, 2010", 15 pgs.
"U.S. Appl. No. 12/109,212, Response filed Oct. 14, 2015 to Final Office Action dated Jul. 24, 2015", 7 pgs.
"U.S. Appl. No. 12/109,212, Response filed Nov. 18, 2011 to Final Office Action dated May 18, 2011", 15 pgs.
"U.S. Appl. No. 12/109,212, Restriction Requirement dated Jun. 13, 2012", 6 pgs.
"U.S. Appl. No. 12/109,228, Advisory Action dated Jul. 23, 2010", 2 pgs.
"U.S. Appl. No. 12/109,228, Examiner Interview Summary dated Mar. 30, 2011", 3 pgs.
"U.S. Appl. No. 12/109,228, Final Office Action dated May 4, 2010", 17 pgs.
"U.S. Appl. No. 12/109,228, Final Office Action dated May 19, 2011", 12 pgs.
"U.S. Appl. No. 12/109,228, Non Final Office Action dated Nov. 9, 2009", 9 pgs.
"U.S. Appl. No. 12/109,228, Non Final Office Action dated Nov. 19, 2010", 11 pgs.
"U.S. Appl. No. 12/109,228, Notice of Allowance dated Dec. 7, 2011", 8 pgs.
"U.S. Appl. No. 12/109,228, Response filed Mar. 9, 2010 to Non Final Office Action dated Nov. 9, 2009", 14 pgs.
"U.S. Appl. No. 12/109,228, Response filed Apr. 19, 2011 to Non Final Office Action dated Nov. 19, 2010", 13 pgs.
"U.S. Appl. No. 12/109,228, Response filed Jul. 6, 2010 to Final Office Action dated May 4, 2010", 13 pgs.
"U.S. Appl. No. 12/109,228, Response filed Sep. 7, 2010 to Non Final Office Action dated May 4, 2010", 14 pgs.
"U.S. Appl. No. 12/109,228, Response filed Nov. 18, 2011 to Final Office Action dated May 19, 2011", 14 pgs.
"U.S. Appl. No. 13/442,728, Advisory Action dated Jan. 14, 2015", 5 pgs.
"U.S. Appl. No. 13/442,728, Advisory Action dated May 16, 2013", 5 pgs.
"U.S. Appl. No. 13/442,728, Decision on Pre-Appeal Brief Request dated May 6, 2015", 2 pgs.
"U.S. Appl. No. 13/442,728, Decision on Pre-Appeal Brief Request dated Jun. 5, 2014", 2 pgs.

(56) References Cited

OTHER PUBLICATIONS

"U.S. Appl. No. 13/442,728, Final Office Action dated Mar. 6, 2013", 17 pgs.
"U.S. Appl. No. 13/442,728, Final Office Action dated Oct. 31, 2014", 16 pgs.
"U.S. Appl. No. 13/442,728, Final Office Action dated Nov. 26, 2013", 14 pgs.
"U.S. Appl. No. 13/442,728, Non Final Office Action dated Jun. 11, 2014", 14 pgs.
"U.S. Appl. No. 13/442,728, Non Final Office Action dated Aug. 8, 2013", 15 pgs.
"U.S. Appl. No. 13/442,728, Non Final Office Action dated Nov. 15, 2012", 12 pgs.
"U.S. Appl. No. 13/442,728, Non Final Office Action dated Nov. 27, 2015", 14 pgs.
"U.S. Appl. No. 13/442,728, Pre-Appeal Brief Request filed Apr. 6, 2015", 5 pgs.
"U.S. Appl. No. 13/442,728, Pre-Appeal Brief Request filed Apr. 28, 2014", 4 pgs.
"U.S. Appl. No. 13/442,728, Preliminary Amendment filed Apr. 9, 2012", 3 pgs.
"U.S. Appl. No. 13/442,728, Response filed Feb. 15, 2013 to Non Final Office Action dated Nov. 15, 2012", 11 pgs.
"U.S. Appl. No. 13/442,728, Response filed May 6, 2013 to Final Office Action dated Mar. 6, 2013", 11 pgs.
"U.S. Appl. No. 13/442,728, Response filed Jul. 8, 2013 to Non Final Office Action dated Mar. 6, 2013", 7 pgs.
"U.S. Appl. No. 13/442,728, Response filed Oct. 7, 2015 to Final Office Action dated Oct. 31, 2014", 10 pgs.
"U.S. Appl. No. 13/442,728, Response filed Oct. 10, 2012 to Restriction Requirement dated Aug. 10, 2012", 5 pgs.
"U.S. Appl. No. 13/442,728, Response filed Oct. 13, 2014 to Non Final Office Action dated Jun. 11, 2014", 9 pgs.
"U.S. Appl. No. 13/442,728, Response filed Nov. 8, 2013 to Non Final Office Action dated Aug. 8, 2013", 8 pgs.
"U.S. Appl. No. 13/442,728, Response filed Dec. 31, 2014 to Final Office Action dated Oct. 31, 2014", 12 pgs.
"U.S. Appl. No. 13/442,728, Restriction Requirement dated Aug. 10, 2012", 6 pgs.
"International Application Serial No. PCT/US2008/061545, International Preliminary Report on Patentability dated Oct. 27, 2009", 2 pgs.
"International Application Serial No. PCT/US2008/061545, Written Opinion Aug. 21, 2008", 5 pgs.
"International Application Serial No. PCT/US2008/061545, PCT International Search Report and Written Opinion of the International Searching Authority dated Aug. 29, 2008", 8 pgs.
"International Application Serial No. PCT/US2008/061554, PCT International Search Report and Written Opinion of the International Searching Authority dated Aug. 14, 2008", 31 pgs.
"StarTech.com—Wall mount bracket—black-4U—19 (RK419WALLV)", [Online]. [retrieved on Jul. 6, 2010]. Retrieved from the Internet: <URL: http://search.dell.co.uk/1/2/17759-startech-com-wall-mount-bracket-black-4u-19.html>, (2010), 2 pgs.
U.S. Appl. No. 13/442,728, filed Apr. 9, 2012.
U.S. Appl. No. 12/109,212, filed Apr. 24, 2008.

\* cited by examiner

APPARATUS AND METHOD FOR HOUSING ELECTRONIC EQUIPMENT AND INCREASING FLOOR SPACE UTILIZATION IN A SECURE ENVIRONMENT

RELATED APPLICATIONS

This application is a continuation of U.S. application Serial No. 13/442,728, filed on Apr. 9, 2012, which is a continuation of U.S. application Serial No. 12/109,228, filed on Apr. 24, 2008, which claims priority to Provisional application Serial No. 60/926,384, filed on Apr. 26, 2007, entitled Apparatus and Method for Housing Electronic Equipment for High Density, each of which is incorporated herein by reference in its entirety.

TECHNICAL FIELD

The disclosed subject matter relates generally to a rack for allowing computer equipment to be mounted vertically to save floor space.

BACKGROUND

The computer industry focuses on manufacturing modular components with uniform widths and incremental heights, expressed as a "U" height where 1U equals 1.75 inches. This invariably results in standard depth cabinets. Thus, each U space is an industry standard 1.75 inches—6U depth would be 14 inches, 8U depth would be 17.5 inches, 10U depth would be 21 inches, and so on. Standard cabinets usually mount components horizontally and have from 25 to 34 inches in allowable component depth, with overall cabinet depths as much as 40 inches. The U height faces the front of a cabinet, and 40U to 42U are available in standard cabinets. In larger "Data Center" applications, these cabinets can house dozens to hundreds of U spaces in equipment. Because these cabinets mount modular components horizontally, they waste a lot of space.

SUMMARY

Disclosed is a rack for safely securing industry standard rack mounted electronic equipment of all types and system configurations in a non-typical manner, in this case, vertically versus horizontally, allowing substantial savings in required floor space when compared to other equipment cabinets. Our rack can be used in any application and is particularly suited for small and mid-sized companies that need only 4U to 10U in equipment storage and typically do not have a dedicated room or closet for such equipment. However, our rack can provide more U space as required.

Standard full size, horizontal mount, cabinets need access to front and back doors and often side panels, thus increasing actual floor space requirements even more. To meet space requirements our novel equipment rack allows rack mount form factored equipment to be mounted vertically, instead of horizontally, as a system in a secured environment and allows up to 400 pounds of rack mount form factored equipment to be mounted. Our rack has interchangeable 4U, 6U and 8U bracket sets, bottom vented panel or bottom fan tray, top lockable cover, and utilizes a common back plate, or base, with a front panel that includes a built-in level for ease of mounting. The rack has an effective working depth of 26 inches for the use of all rack mount form factored equipment, without restriction as to equipment function. Examples include, without limitation, fiber optic nodes, phone systems, broadband hubs, power conditioning, power backup, power distribution and data networking. This working depth is the vertical dimension in our application and can be expanded based on the user's equipment growth. The apparatus can be mounted on any solid surface such as a wall or a relay rack, for example a two-post rack, and is easily installed by a single technician. The rack can be implemented in a commercial version or a secure version.

Commercial Version of Rack

In one implementation, our rack allows 4U of vertically mounted rack mount form factored equipment to be mounted in an apparatus with a total depth from wall of only 11 inches. In addition, the apparatus includes an additional 2U of patch panel space available integrated in the main back plate, or base. The rack can also include an integrated common earth grounding stud on the base for safety.

Our rack allows the use of all rack mount form factored equipment to be optimized in restricted access as well as space applications. This is done by an equipment frame substantially improving the use of all rack mountable equipment optimized in restricted space applications.

Our rack further allows the use of interchangeable support arms in 4U to 10U, or other suitable dimension) increments that allow for expansion without full replacement of rack mount form factored systems and can be mounted on any solid flat vertical surface and industry standard 19 inch relay racks, e.g., two-post racks. Solid flat surfaces our rack can be mounted on include, but are not limited to, walls such as poured concrete, concrete block, brick and gypsum with wood studs 16 inches on center. An integrated standard mounting pattern for 1U or 2U CAT5e patch panels further increases installation efficiency and space utilization of our system. When used with integrated cable management bridge lances to dress and tie down both power and data cabling, this further increases installation efficiency and space utilization of cabinet systems.

Our rack also allows data and power cabling access from top, bottom or back. Further, the back panel allows feed through of data cabling and airflow.

When our rack is used as taught herein, rack mount form factored equipment can be optimized in restricted space applications with two-post mounting configured "back to back". In this configuration two-post racks can be used. As one example, the two-post rack can be comprised of extruded aluminum with threaded holes on both front and back faces, materials other than aluminum can be used. The rack can mount through this hole pattern and can be set flush to the mounting surface for back-to back installation for increased component density.

Another feature of our rack is threaded holes (2 per side in one embodiment) in the back plate to allow retainer screws to be installed through the brackets to keep the brackets from dislodging during equipment installation, service or by accidental impacts.

Secure Version of Rack

Our rack can also be made in one or more secure versions for installation in places like prison facilities and can have extra levels of tamper resistance that make the rack very difficult to damage, open by picking or prying, disable, sabotage, and other activities that intended to prevent internal equipment from operating. This differentiates a secure version from a commercial version.

For example, while a commercial version of the rack could have louvers or a venting hole pattern on the top part of the base, and/or the sides or the top cover, for convection cooling, a secure version can include tamper resistance by adding baffling of ventilation areas, for example in both top and bottom vent patterns.

As another example, while a commercial version of our rack can have a bottom fan tray that would have fans with wire grills and be applicable in most situations, a secure version can have an additional layer on the outside containing offset baffles wherein the fans cannot be tampered with or easily splashed with liquids.

Likewise, a commercial version could have a single cam lock without a security collar or escutcheon and be acceptable for most situations. The secure version can have two cam locks with security collars and the standard pivoting cam lever replaced with a custom double cam, thus allowing four points of contact for locking the cover of the cabinet.

As yet another example, the commercial version could have 2U of space to allow patch panel rack mountable components in most situations, whereas the secure version could prevent using this space on the base so that the secure cover of the rack can use the inside edges to align the cover and thus improve tamper resistance of the cover.

Finally, the rack can be designed to be assembled in an overlapping fashion which allows no exposed hardware throughout system with the last piece to be assembled being the first to be removed in sequence in A lockable cover, with double cams as set forth above. This feature would usually have no exposed mounting hardware, and nothing to disassemble. Thus it would not allow unauthorized access, damage or theft. In this design the back plate or base can be mounted to a wall or two-post rack. The side brackets would slip into place, as discussed herein, secured in place by screws, such as set screws in one example. The top cover locks would slide through the front panel cut-outs, can fully enclose the space, and can be secured with one or two locks as set forth above.

The rack has an optional fan in a fan tray, but can have convection cooling with a vented bottom panel of the base, with vented upper sides of the base if desired. There can be fans housed in the bottom of the panel assembly of the base to force air in or out. There can also be a forced air fan assembly in the bottom panel assembly with an internal thermal switch for increased efficiency and fan life. A thermal sensor switch can be mounted in side the rack cabinet and can turn on when internal temperature reaches a certain level and shut off when the temperature drops to a predetermined level; such as, for example, 25 degrees F. Thus the fan would run only when needed, increasing service life.

BRIEF DESCRIPTION OF THE DRAWINGS

Various aspects of the apparatus will now be described with reference to the following figures, not necessarily drawn to scale.

DETAILED DESCRIPTION OF THE PREFERRED EMBODIMENTS

Figure 1:
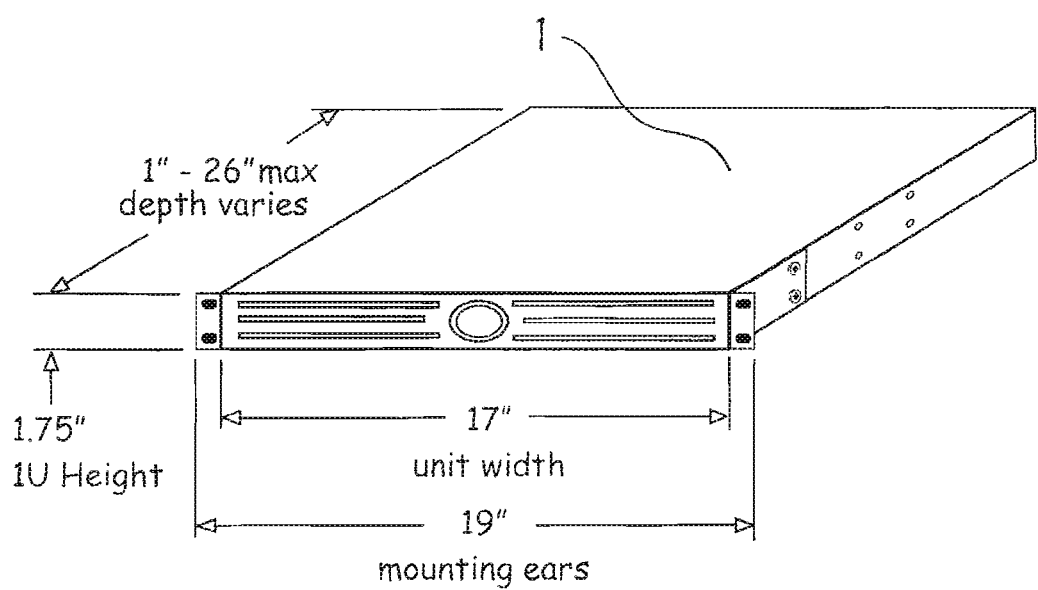
FIG. 1 illustrates a standard component of electronic equipment that is rack mounted in computer data centers.

FIG. 1 illustrates a standard component of electronic equipment 1 that is rack mounted in computer data centers. Typical data centers maximize rack cabinet density, and standard cabinets are 30 to 34 inches in depth. Cabinet housings have 1.75 inch unit spacing which conforms to the component multiplier. Standard battery backup power supplies, as an example, are 2U high and 20-26 inches in depth.

Figure 2:
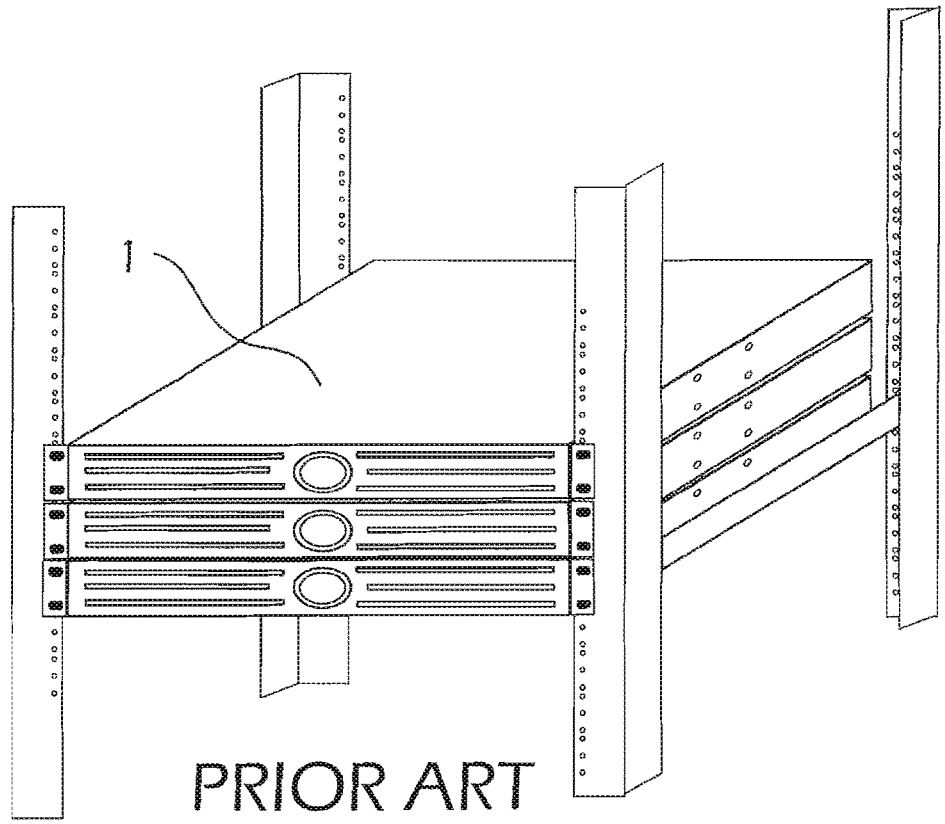
FIG. 2 illustrates a prior art method of mounting standard components horizontally.

FIG. 2 illustrates a typical prior art method rack for mounting components of electronic equipment horizontally.

Figures 3A, 3B:
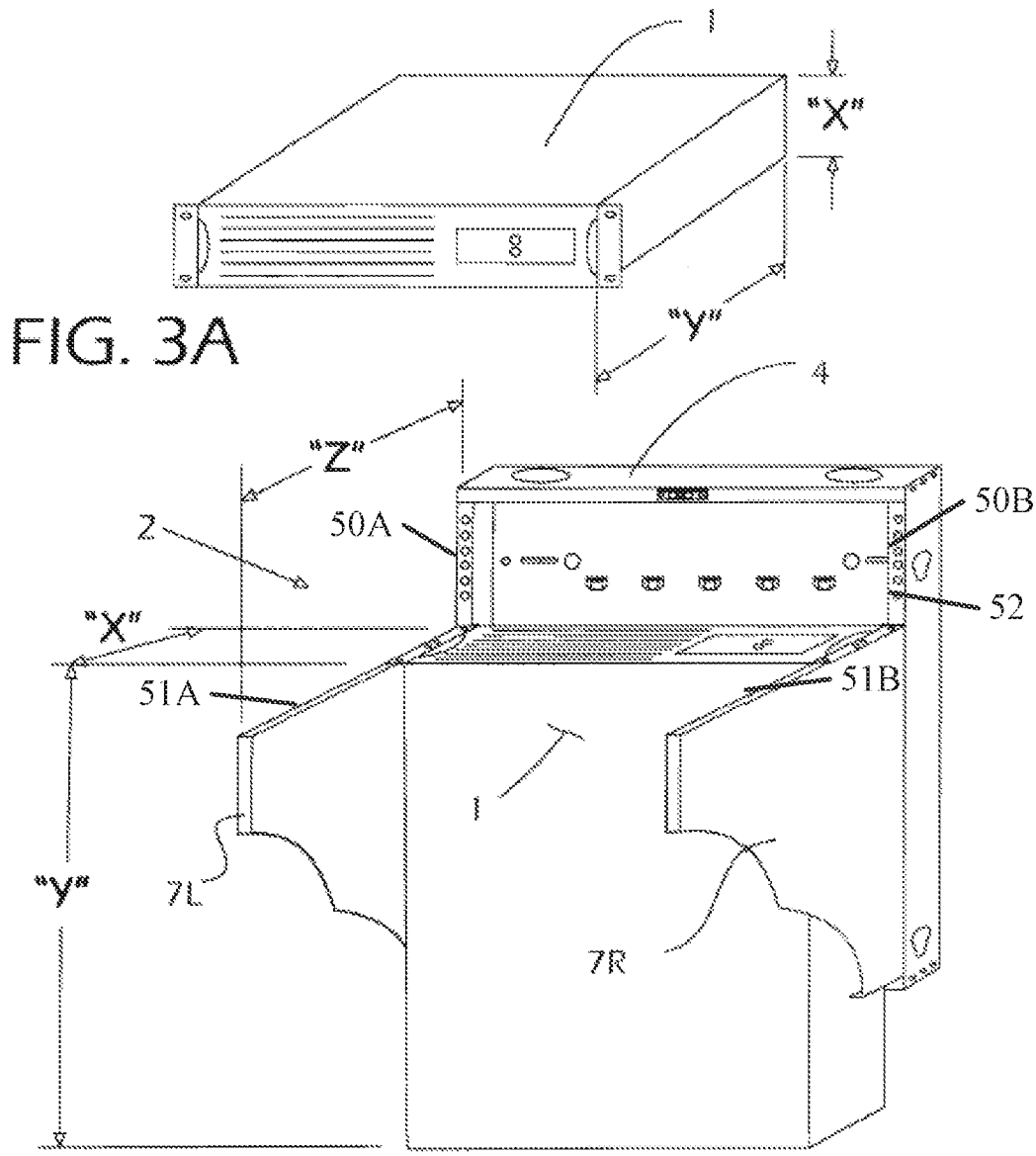
FIG. 3A illustrates an electronic component showing its dimensions.
FIG. 3B illustrates schematic view of an embodiment of our rack that mounts standard components vertically.

FIG. 3A illustrates a rack mountable component 1 that typically has a deep measurement of y inches, a height of x inches.

Figure 8A:
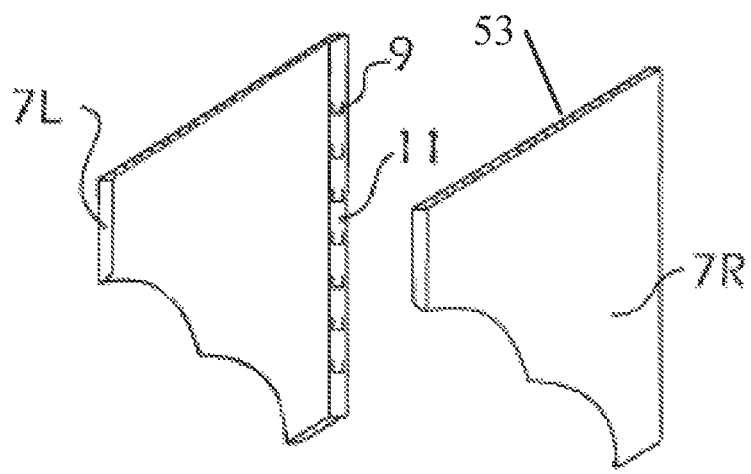
FIG. 8A is a more detailed illustration of one embodiment of the brackets of our rack.

FIG. 3B shows the rack-mountable electronic component 1 vertically mounted on our rack 2 Rack 2 includes base 4 and brackets 7L and 7R. All parts of our rack can be made of 14 gauge steel. Component 1 is mounted vertically by the brackets or side panels 7L and 7R which include horizontal mounting surfaces 51A and 51B, and can be secured by screws. Holes 53, as shown in FIG. 8A, may he included to facilitate mounting. The horizontal mounting surfaces 51A and 51B may be located below vertical mounting surfaces 50A and 50B. Vertical mounting surfaces 50A and 50B may include holes 52 to facilitate mounting. The brackets or side panels of the rack are of length z which is shorter than the depth y of the rack-mountable component. Hence when the component 1 is mounted as shown, the square footage taken up by the rack with the component mounted is less than in typical configurations used in the industry.

Figure 4A:
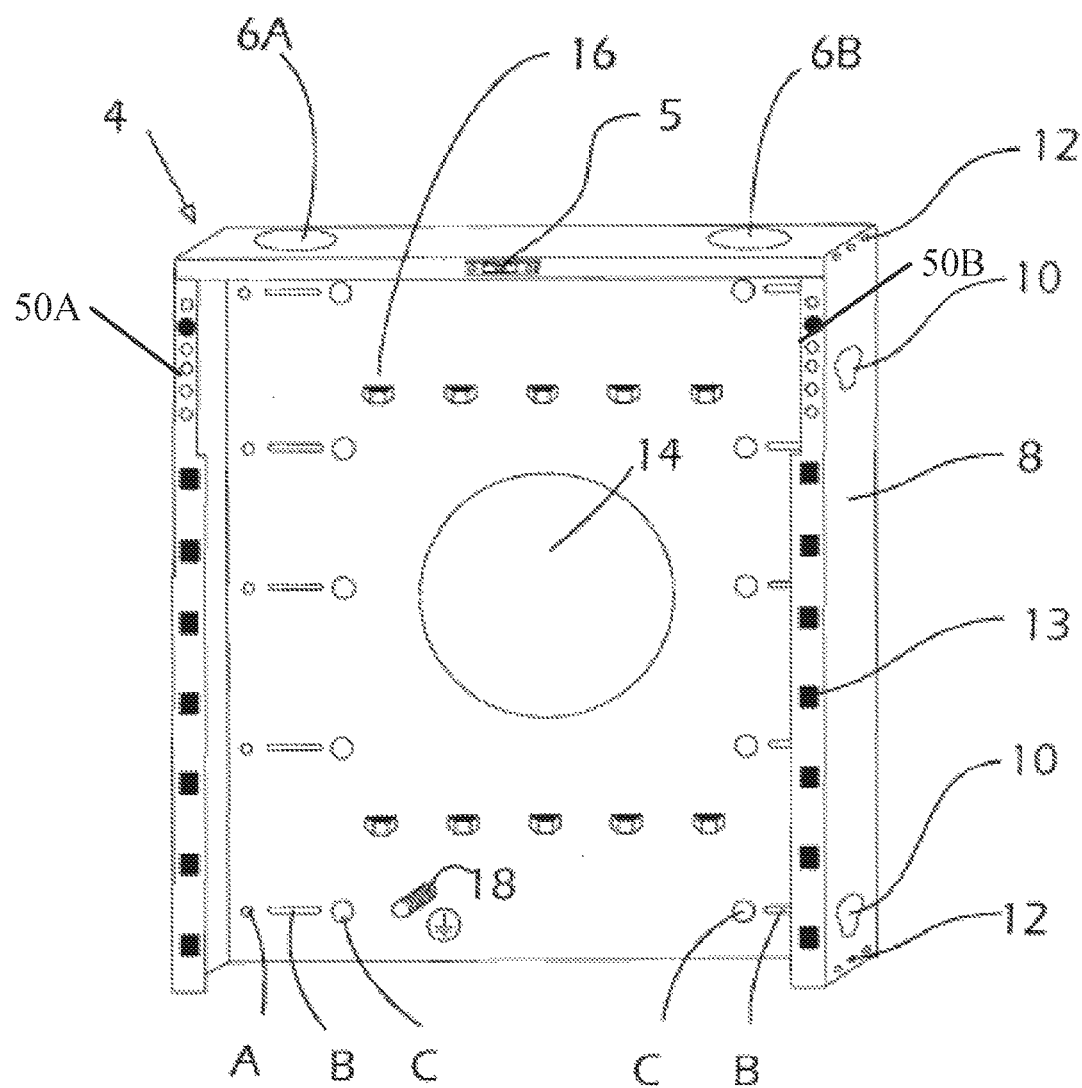
FIG. 4A, is a front view of the base, or back panel, of our rack.

FIG. 4A shows a front view of the base, or back panel, 4 of our rack. Top access for data cable or power cable is seen at 6a and 6b. Built-in level 5 allows easy installation for single service personnel. Side panel 8 allows attachment of a 1U or 2U patch panel directly inside the back panel without sacrificing any space in the mounting surface of the side panels. Openings 10 and 12 allow ancillary equipment, both rack and non-rack mountable, to be attached to the side panel by hanging or screwing onto the back panel. Large rear panel access, 14, which may be circular or of other configuration, allows pass-through cable routing in two-post back-to-back mounting applications. Bridge lances 16 are incorporated into the rack to allow data and power cable management for input and output wiring with top or bottom egress, as well as to facilitate service loops. A grounding stud 18 is integrated into the base further assisting quick and convenient system installation. This provides a method for easily attaching the installed equipment to a building's earth ground system. The back-plate of the rack allows three mounting options. Holes A (both left and right, with right hole A hidden in the figure) accommodate toggle bolts for mounting on block walls or an electrical panel. Slots B are centered at 16 inches for allowing the base to be secured by screws that are screwed into studs or other wood surfaces using #10 or other suitable screws. Holes C allow mounting to a two-post rack such as a standard two-post open frame rack. Finally, the base has cutouts 13 on both sides of the base that match location of tabs on brackets 7L and 7R as illustrated subsequently in FIG. 8A and FIG. 8B.

Figure 4B:
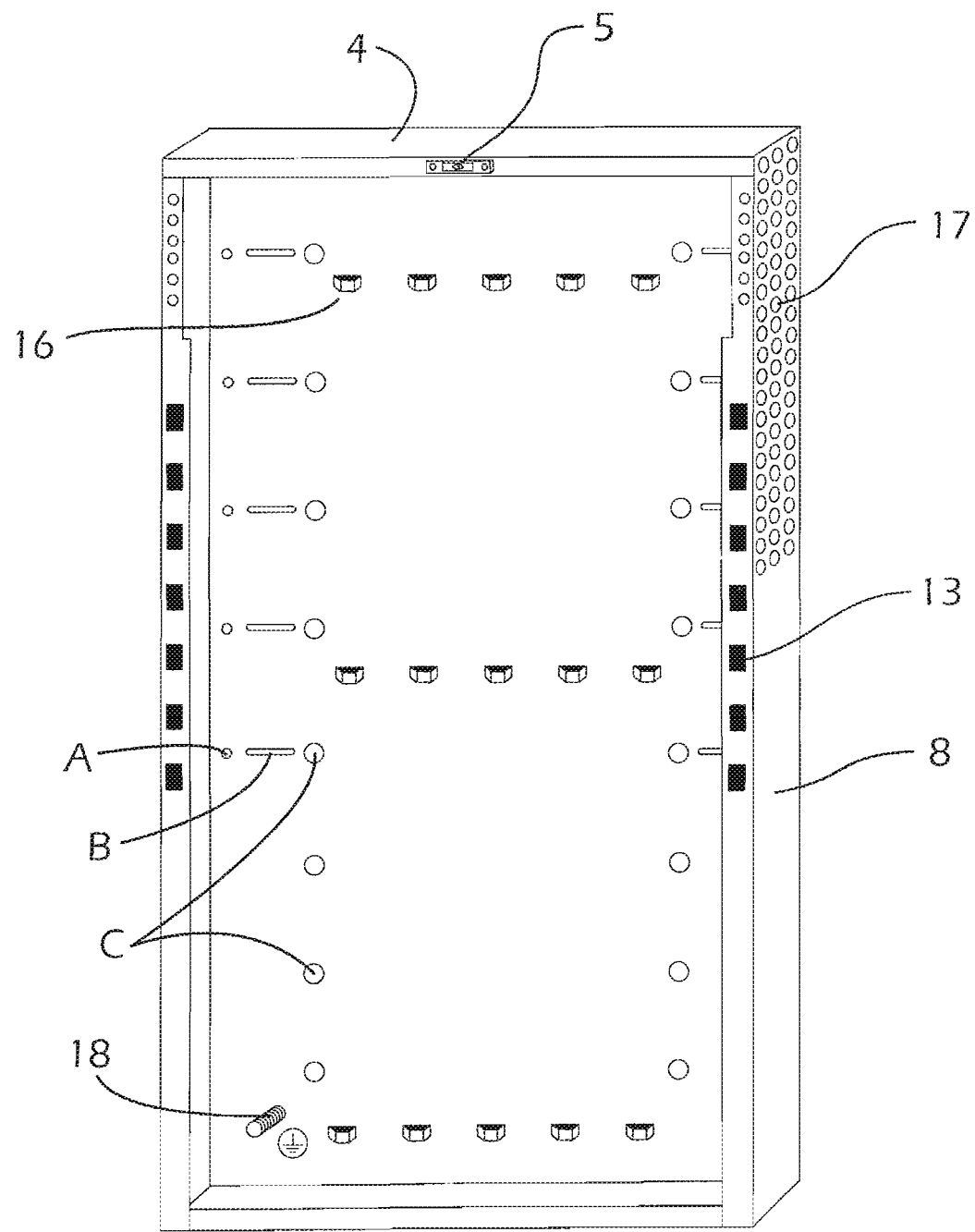
FIG. 4B illustrates a more secure version of the base of our rack.

FIG. 4B illustrates another, more secure, embodiment of the base of our rack. This embodiment can incorporate certain of the features of FIG. 4A and, in addition, is an elongated version with more secure features. For example, baffles 17 comprise a baffled air intake that can be on both sides of the base or back plate for secure ventilation. This can work with a temperature controlled fan tray assembly at the bottom of the base, to be explained subsequently. Ancillary equipment such as a patch panel or other equipment can be mounted, in the secure version, in the 4U-10U (or other suitable dimension) bracket spaces, discussed above, which keeps the system secure.

Figure 5:
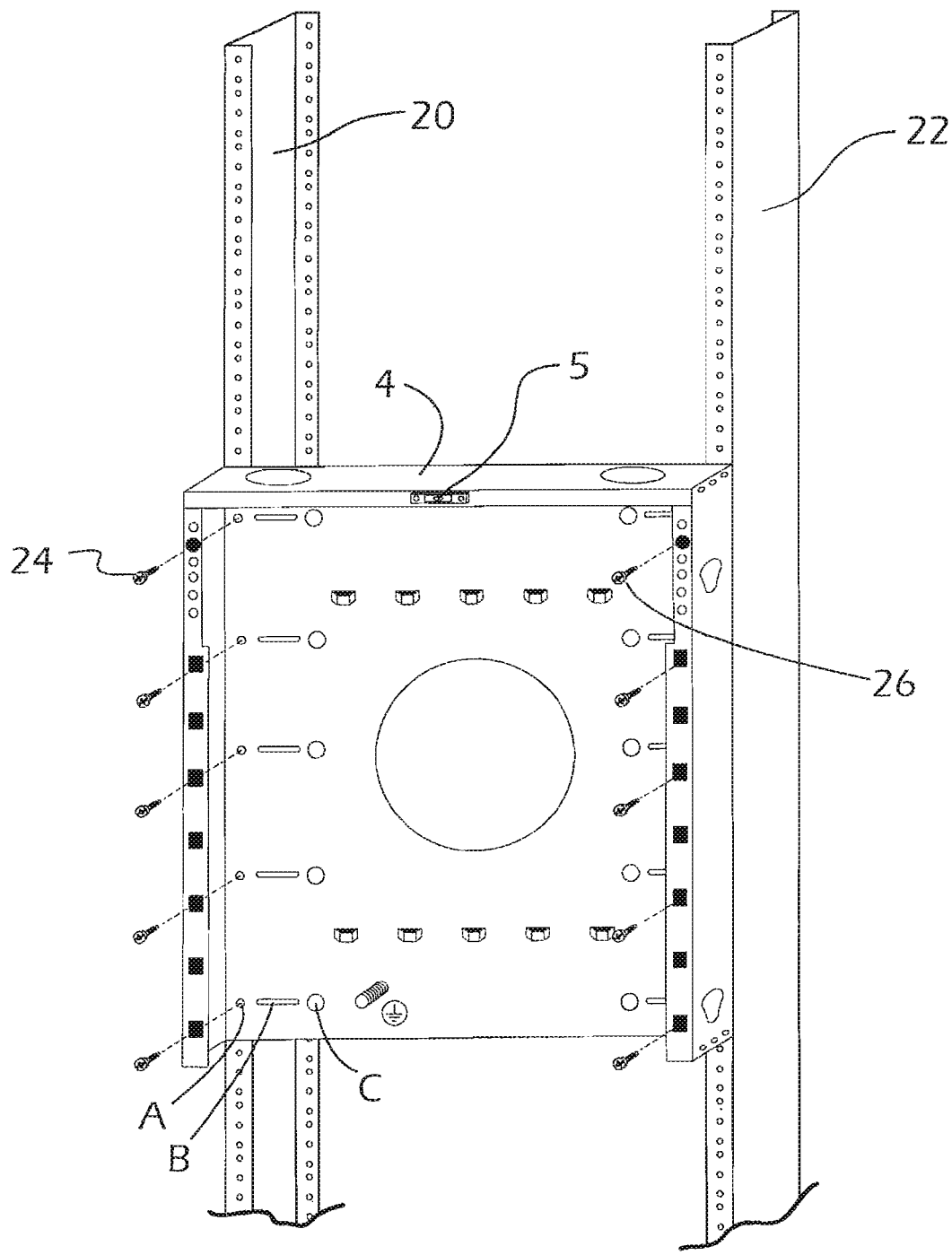
FIG. 5 is a view of the base of our rack showing two-post mounting.

FIG. 5 shows base 4 of the rack being mounted to a two-post (20, 22) computer rack. Both top and bottom of the two-post rack should be secured before loading our rack. The base can be installed using #12-24 screws (24, 26) at the top using the integrated level 5 to locate the proper mounting pattern. Usually 10 screws are recommended for a full payload rating of our rack. The extended base 4 of FIG. 4B can be used as well.

Figure 6:
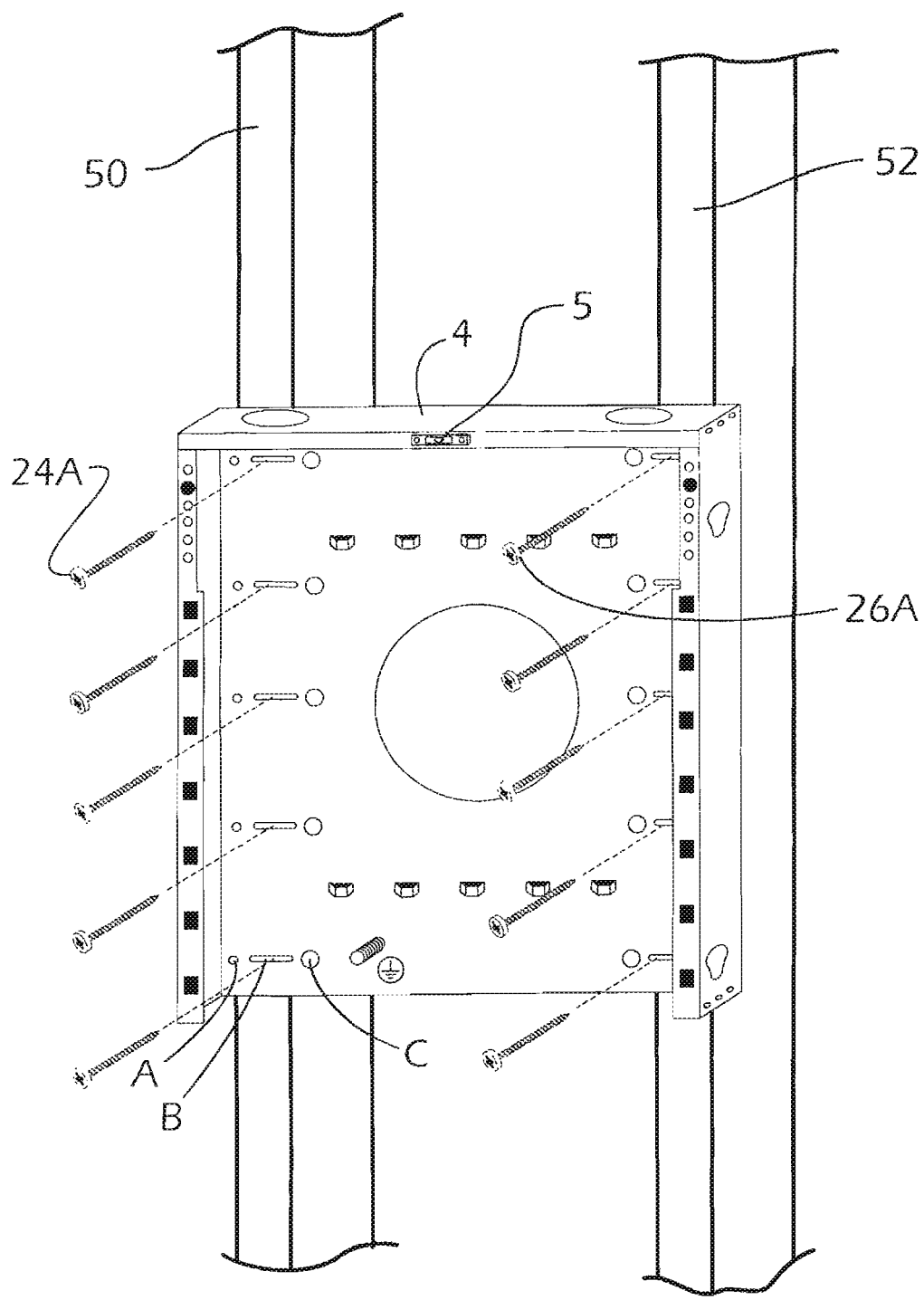
FIG. 6 is a view of the base of our rack showing mounting into 16 inches on center solid wood wall studs.

FIG. 6 shows mounting the base 4 into 16 inches on center wood (or other appropriate material) wall studs 50, 52. The studs should be located before marking the top two locations for pilot holes. Pilot holes of 0.150 inch, or other suitable dimension, can be drilled at the top using the integrated level 5 to locate the proper mounting pattern. One can begin installing wood screws 24A, 26A in the pilot holes at the top and then drill and install the remaining screws in the pattern. Ten screws are recommended for full payload rating of the rack but any suitable number can be used.

Alternatively, the rack can be mounted to a cinder block or other approved hollow wall using hole pattern C shown in FIG. 4A. This is recommended for high security applications.

For installation to an approved hollow wall, one would place the base against the wall in the preferred location. Using the integrated level 5, one would adjust the panel to level and then mark a minimum of the two top and bottom ½ inch or other suitable dimension clearance hole (hole C). The marked holes can be drilled and compression studs or other associated inserts can be applied as required. The base can be lifted and the bolts can hand tightened, with fender washers, most of the way into the stud and then all screws can be tightened. An approved hollow wall application is considered to be either a cinder block wall or NEC type ¾ inch plywood electrical panel backing using toggle bolts for a safely fully rated load of the rack.

For mounting on a block wall, ¼ inch by 3 inch toggle bolts can be used to support the base of the rack. The hollow pocket in the block should be located so that the toggle bolt can open properly to support the weight. Toggle bolt clearance hole can be ½ inch.

Figure 7:
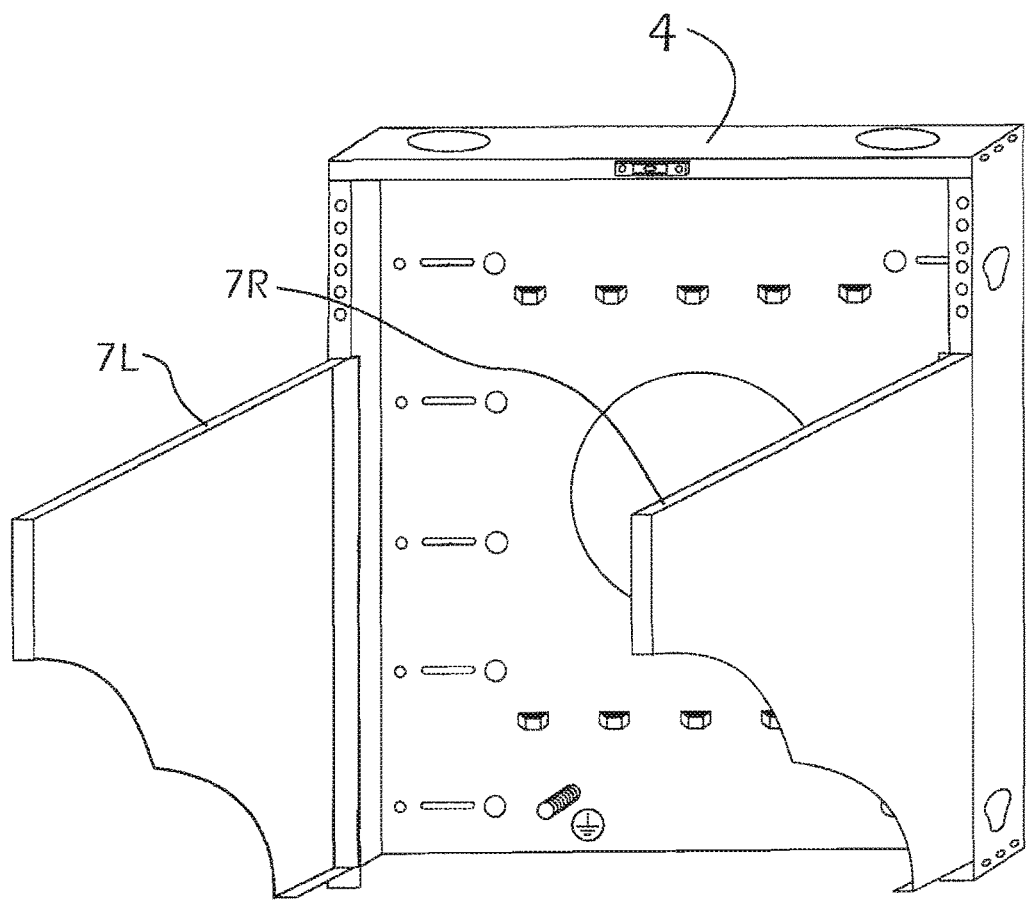
FIG. 7 is a view of our rack showing the brackets thereof.
Figure 8B:
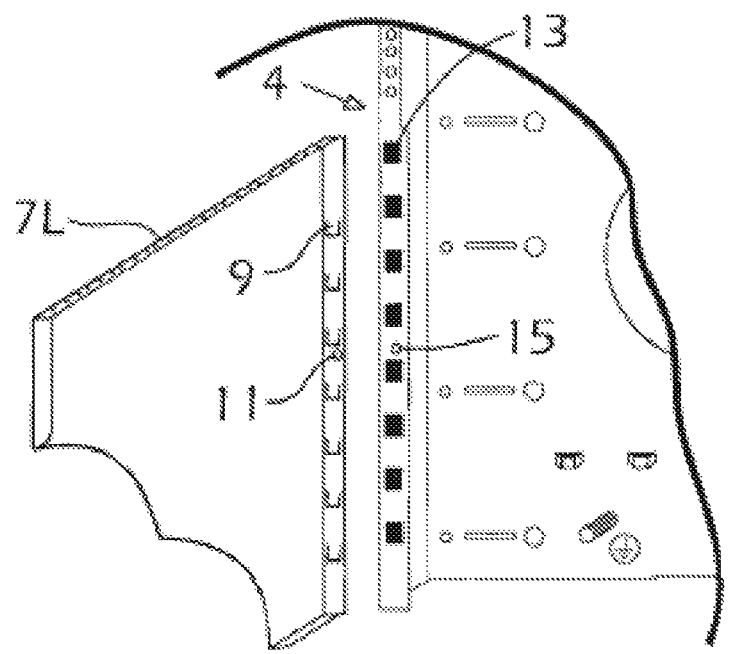
FIG. 8B is an illustration of one manner of attaching brackets to our rack.
Figure 8C:
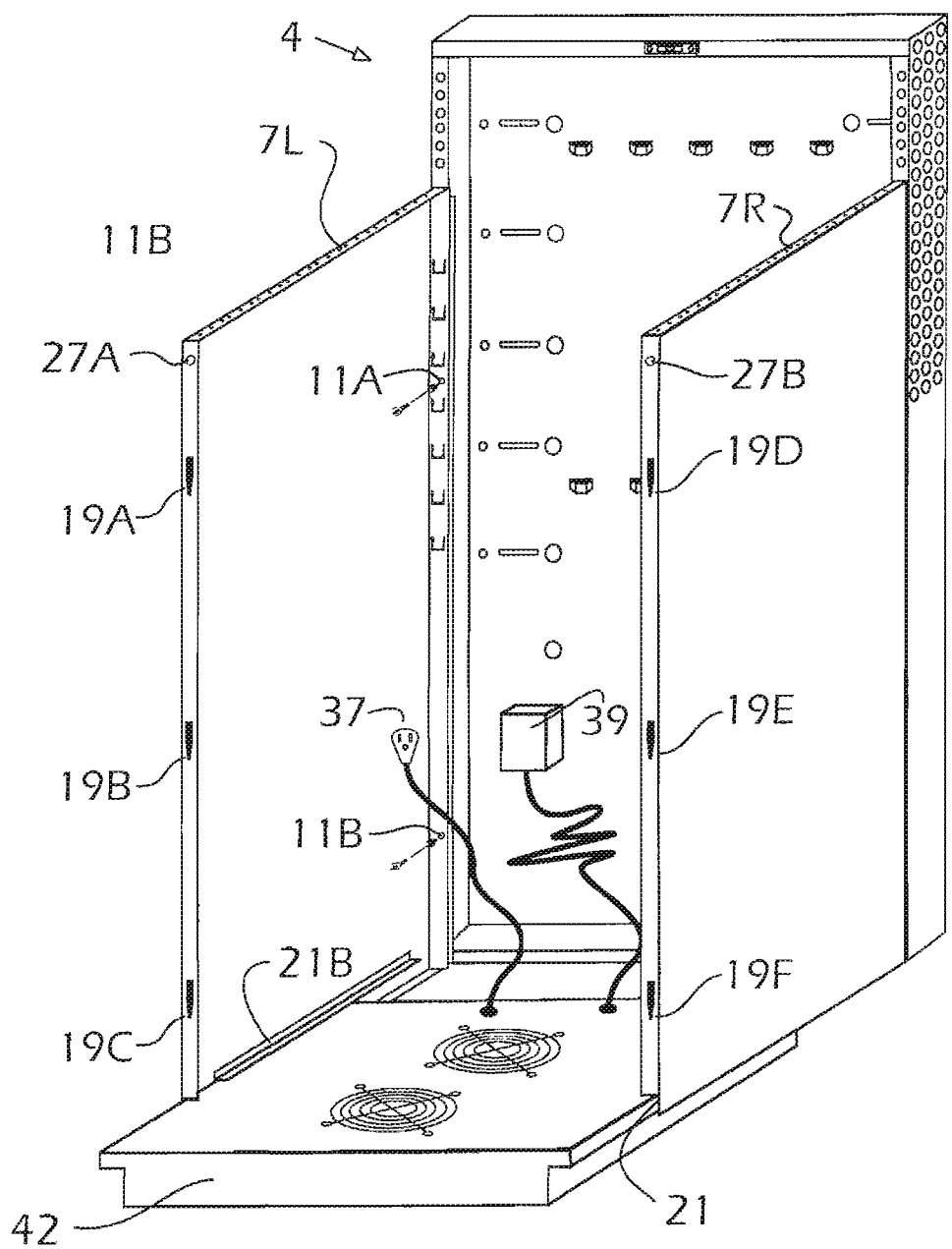
FIG. 8C is an illustration of longer brackets attached to a secure version of our rack.

FIG. 7 illustrates brackets or side panels 7L, 7R that are attached to the base 4 of the rack. The brackets can be marked in standard 1U (1.75 inch) spacing set horizontally instead of vertically for the typical cabinet. The rack allows attachment of the brackets by hooking spaced spring tabs into cutouts or notches, both the tabs and the notches are shown in FIGS. 8A to 8C. The brackets can be made in sizes such as 4U, 6U, and 8U and typically use the same backplate.

FIG. 8A shows brackets 7L and 7R. The illustration of bracket 7L shows its inside surface with tabs 9 running vertically, and bracket security screw hoe 11. Bracket 7R is similar.

FIG. 8B shows a close up view of the bracket 7L being secured to base 4. Securing bracket 7R is done similarly. The base has cutouts 13 that match the location of tabs 9 on bracket 7L. One bracket should be engaged on the base at a time, confirming that all tabs 9 are nested into cutouts or notches 13 on the base, and then slid down to fully set the bracket. The clearance hole 11 in bracket 7L should align with a threaded hole 15 in the base or back plate. A screw such as a #12-24 screw can be tightened through hole 11. Securing the opposite bracket 7R is done in the same manner as described for bracket 7L.

FIG. 8C illustrates longer brackets 7L, 7R attached to a secure version of our rack. A longer back panel can be used for a secure version of our rack. Longer side brackets 7L and 7R can be used since the back panel can accommodate all bracket sizes available, 4U through 10U, protecting the entire height of the rack. After engaging the tabs, as previously explained, two #12-24 safety screws can be installed through holes 11A and 11B, installed much like element 11 in FIG. 8A and FIG. 8B, through each side bracket. Patch panels, if desired to be used in the secure version, can occupy hanging U space on the inside of brackets 7L, 7R. Tamping the bracket down with a mallet can be advisable, taking care to protect the finish of the rack from marring by using a cardboard buffer while nesting the tabs. The brackets can have slots, here three, 19A, 19B, and 91C, located on the front of each bracket firmly fitting front panel hooks, to be described, which slide down to fully set the bracket. The front panel is secured at the top with two #12-24 screws. Slots or cutouts 21 located at the bottom of each bracket will allow a fan tray, describe below, to slide in and be locked when the front panel is installed.

FIG. 8C also illustrates a fan tray, or fan assembly, 42, discussed briefly above, that is sized to fit; and matched the U space of the brackets and top cover from 4U to 10U cabinets, as one example. The fan tray is aligned with fan grills and wiring facing up and slides into the cutouts 21 at the bottom of each side bracket. The bottom of each bracket 7L and 7R can have bracket 21B affixed thereto by welding or other suitable securing means, to enable the fan assembly to slide appropriately into position. Each fan tray is sized to fit and matches the U space of brackets and top cover from 4U to 10U cabinets. The fan tray assembly has an AC input cord 37 and a temperature sensing module 39 attached, The sensor can be mounted centrally on the back panel by sliding the tab into one of the convenient bridge lances or by using the supplied velcro® (Velcro is a trademark of Velcro Industries). The AC input plug of the fan tray should be connected to an internal AC source, and a UPS output, (if available), is recommended, The fan tray is secured by attaching the front panel to the left and right side panels of the cabinet as explained more fully in FIG. 8D.

Figure 8D:
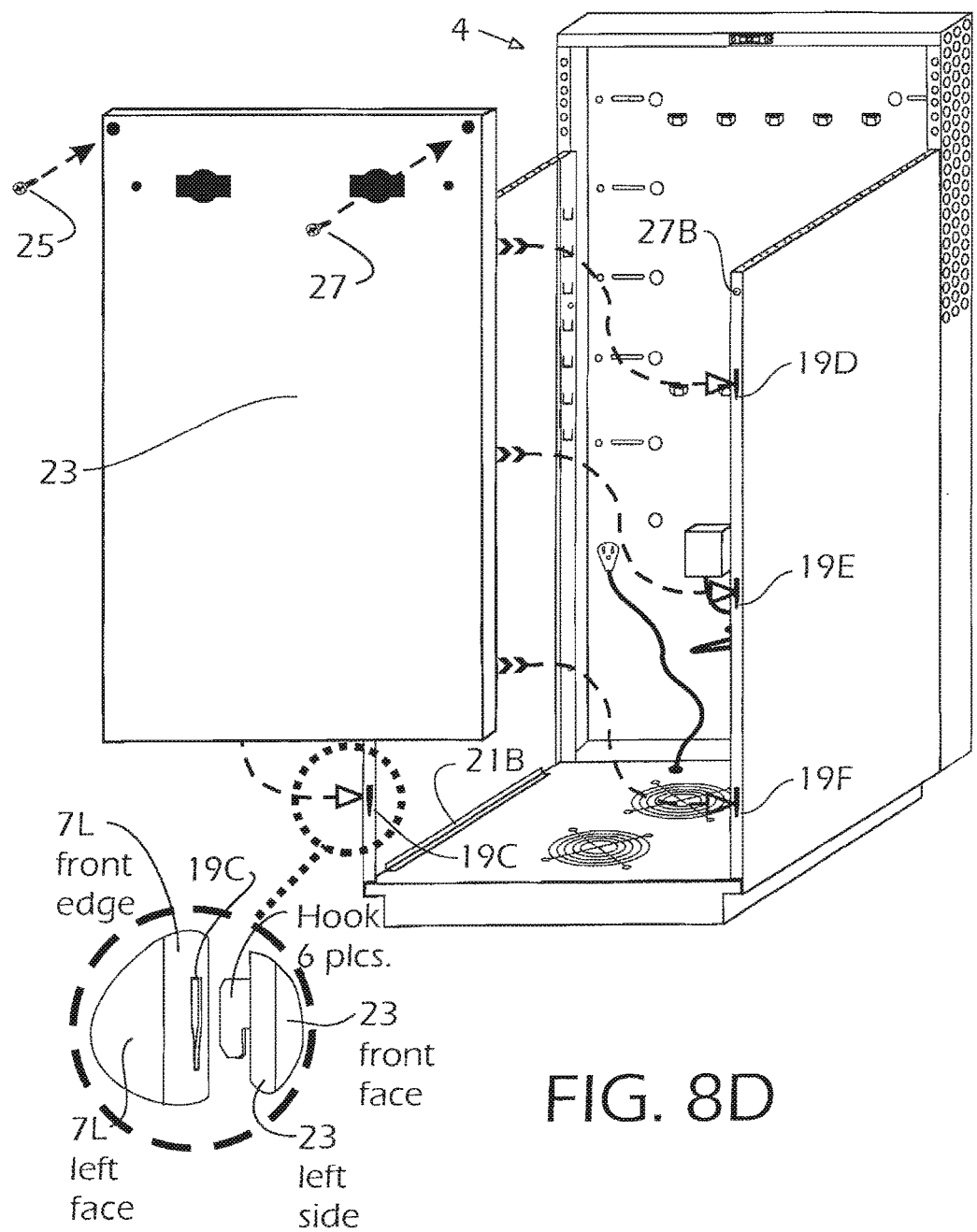
FIG. 8D is an illustration showing the front panel of our rack, and a method of its installation.

FIG. 8D illustrates how the front panel is installed via hooks into three slots, 19A through 19F, in the front of both side brackets. Slots 19A and 19B are hidden in this figure but are seen in FIG. 8C. Next, front panel 23 slides downward until security screws 25, 27 can be installed through holes at the top of front panel into holes 27A and 27B in each side bracket.

Figure 8E:
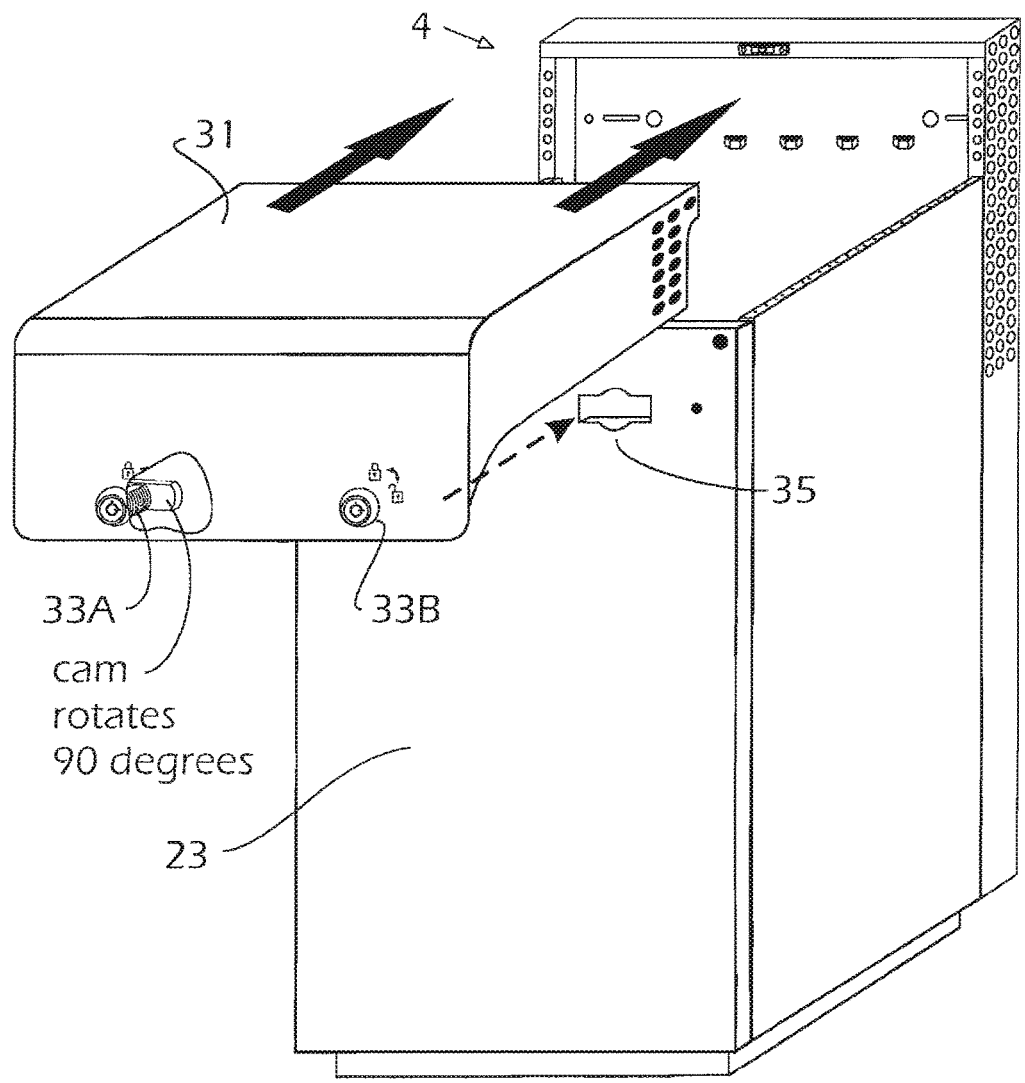
FIG. 8E is an illustration showing the top cover of our rack and a method of its installation.

As seen in FIG. 8E, once the front panel 23 is secured, the top cover 31 can be slid into place. The high security double cam locks 33A, 33B should be in the unlocked (horizontal) position. Otherwise the cams will not fit through the clearance cutouts 35 in the front panel. It will be recognized by one or ordinary skill in the art that many modifications can be made in the top cover-front cover design without departing from the spirit or scope of the invention. As just one example, while the illustrated top cover actually goes over the front cover with a lock mechanism on the top cover and the receptacle for the lock on the front cover, one could modify the secure rack so that the top cover abuts the front cover behind the front cover, with the lock mechanism on the front cover and the lock mechanism receptacle on the top cover. So the lock mechanism associated with the top cover and the front cover could be located on either the top cover or the front cover, depending on how one designs the abutment of those two covers.

Figure 8F:
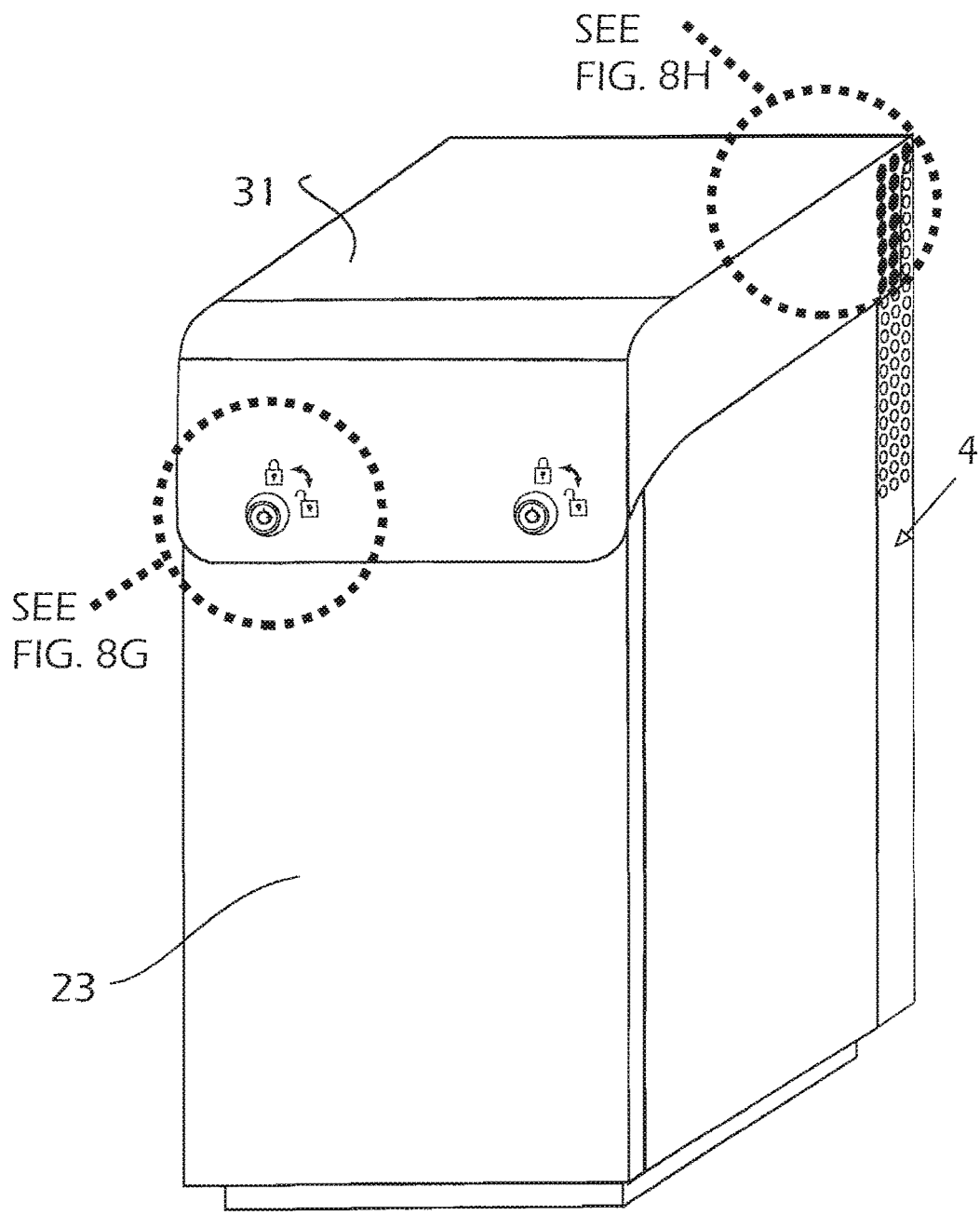
FIG. 8F is an illustration showing the combination of the front panel and the top cover in relationship to each other.
Figure 8G:
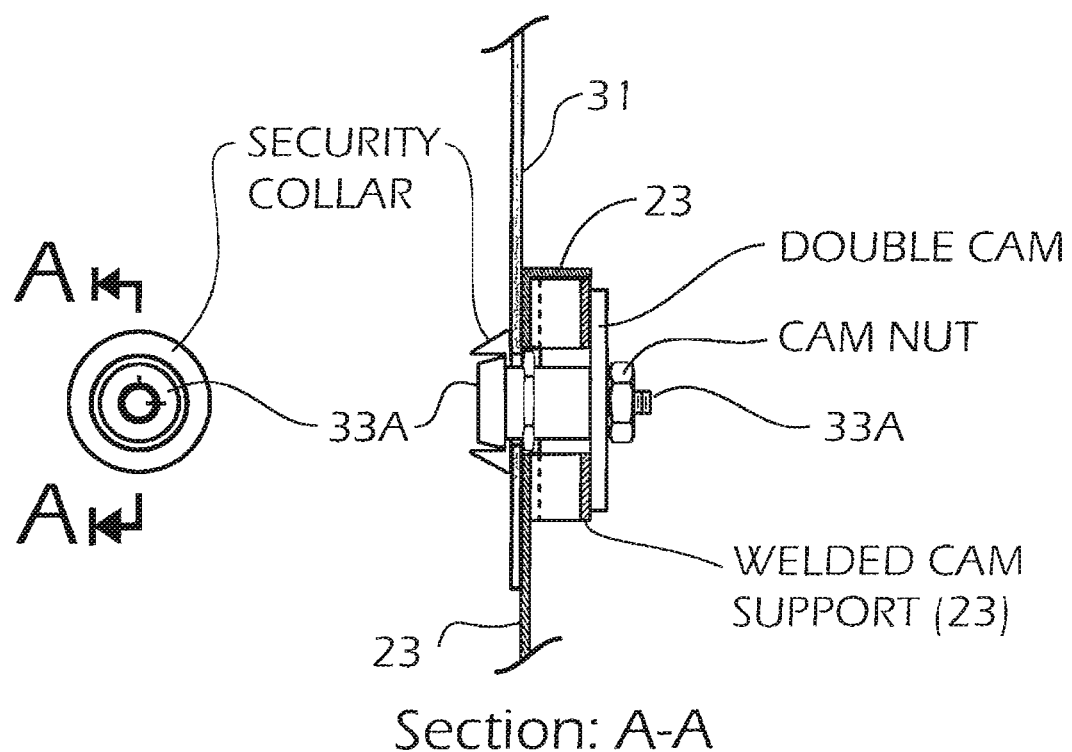
FIG. 8G is an illustration showing the locking relationship of those the front panel and the top cover.
Figure 8H:
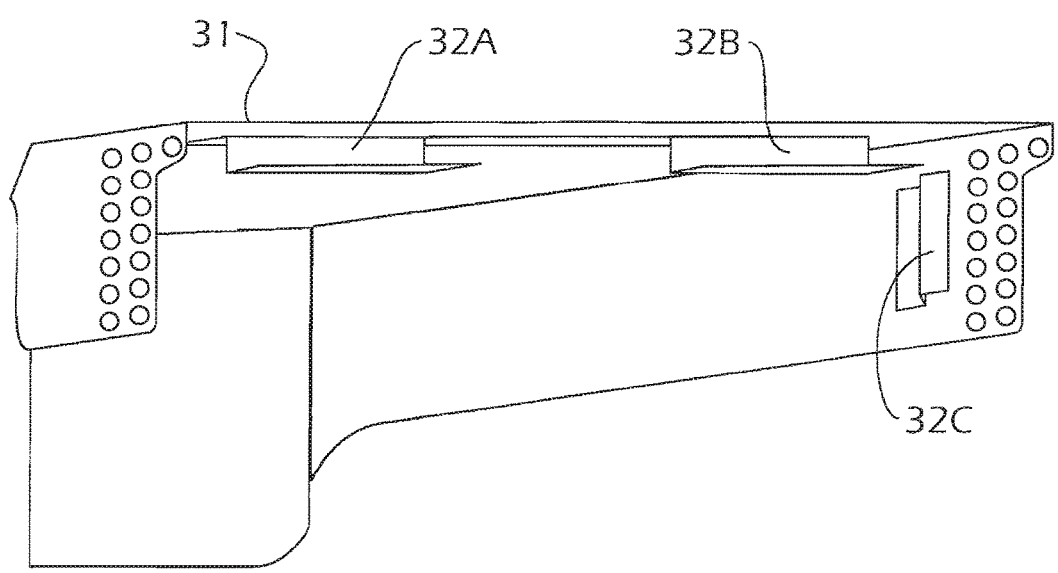
FIG. 8H is an illustration showing the back of the top cover and illustrates how flanges allow the top cover to mate with the backing plate.

FIG. 8F shows the combination of the front panel and the top cover in relationship to each other. FIG. 8G shows the locking relationship of those two elements. FIG. 8H shows the back of the top cover and illustrates how the flanges 32A-32C allow the top cover to mate with the backing plate.

Figure 11:
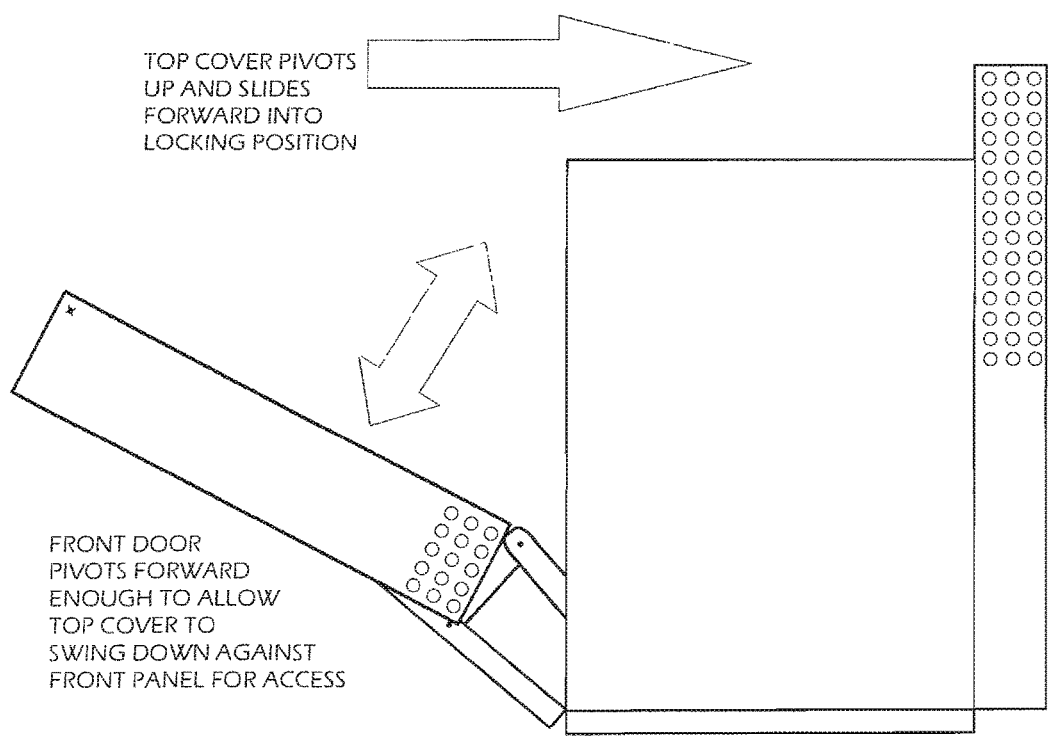
FIG. 11 shows an alternate embodiment of our panel with a front panel and top panel arranged to allow easier access to the components.

Another alternate embodiment is seen in FIG. 11. In that embodiment, a secure combination front panel and top cover is provided, the front panel and top cover secured at the top. This can be equipped several ways wherein after installation and set up, access to the front face of the mounted equipment can be done without the dismantling of the top cover. One way uses two rails or front frame attaching in various ways, the ways being within one of skill in the art, to the front edges of the left and right brackets. The frame can allow the bottom edge of the front panel pivot points and a stop mechanism to keep the front panel from swinging too far, thus preventing injury to the assembler or the person accessing the mounted equipment. The top edge of the front panel will have contact points for allowing a pivoting top cover to swing forward and engage the back plate in a similar fashion as the design that was described earlier, and be held in place with one or more locks on the front panel. When opening, the top cover can swing down and rest on the front panel, as seen in dashed line format, allowing front access to the mounted equipment.

Figure 9:
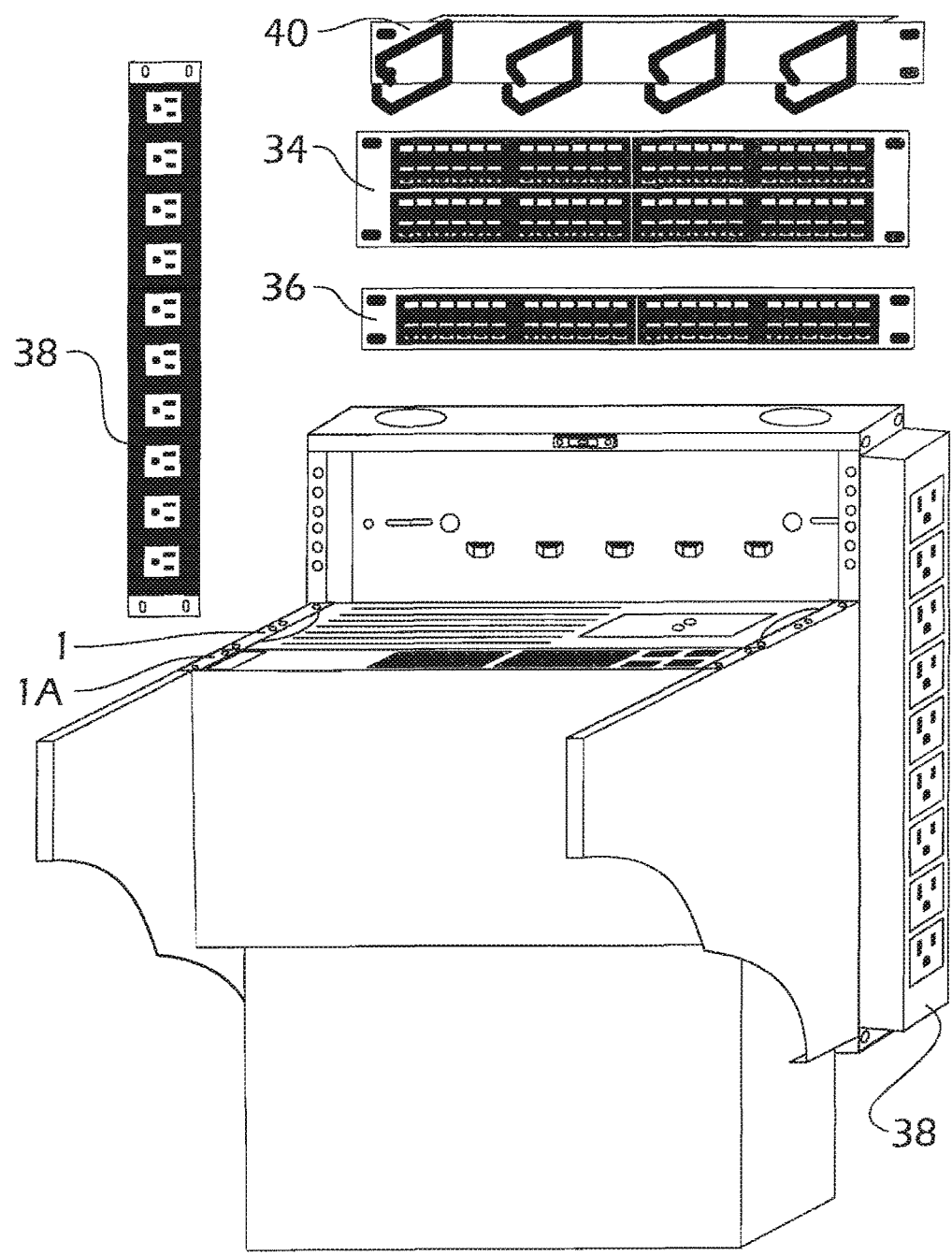
FIG. 9 is an illustration of our rack with two components mounted vertically thereon, also showing the location of patch panels and side components.

FIG. 9 shows the rack loaded with two different types of rack-mountable equipment components, 1, 3 in space saving vertical arrangement. Patch panels 34, 36 can be added at the top of the base. Power distribution unit 38 can be added on the side of the base. Cable management hooks 40 can be added to the top or the side to manage cables such as CAT5 cables.

Figure 10A:
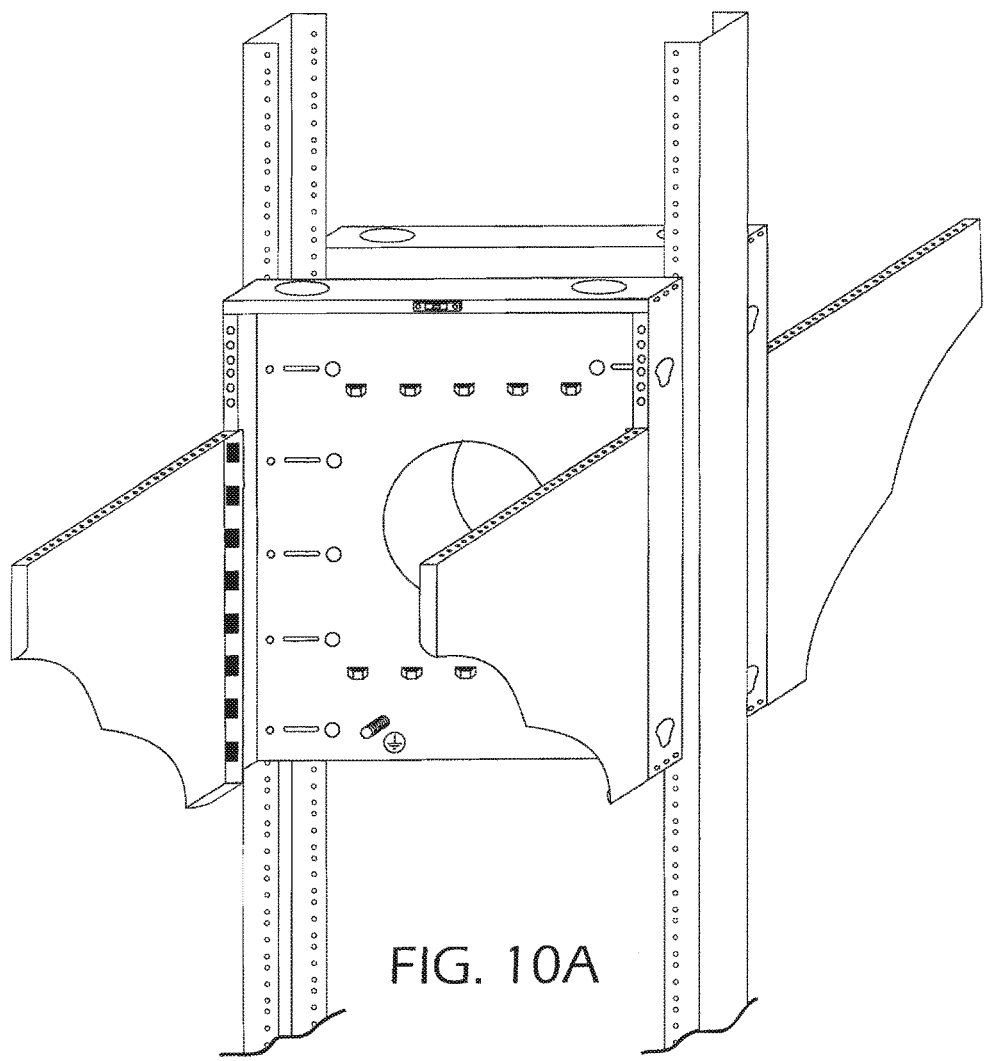
FIG. 10A is a perspective illustration showing our rack in "back-to-back" relationship.

FIG. 10A is a perspective illustration showing our rack in "back-to-back" relationship to show one of the space saving features described above. Only the base or back plate is shown in FIG. 10A but the reader will appreciate that the entire rack can then be built up from that, as described above.

Figure 10B:
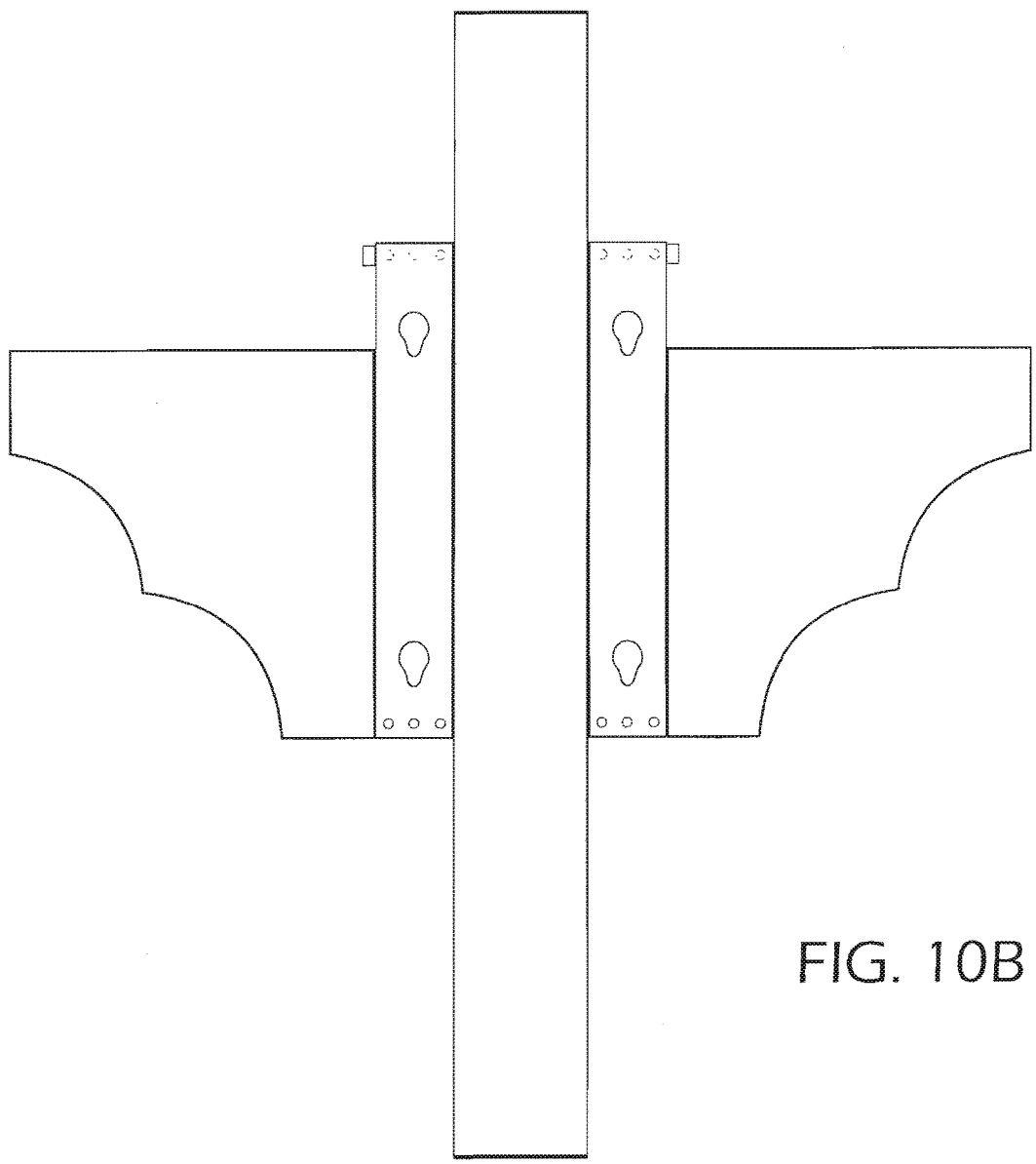
FIG. 10B is an illustration showing a side view of our rack in a "back-to-back" relationship.
Figure 10C:
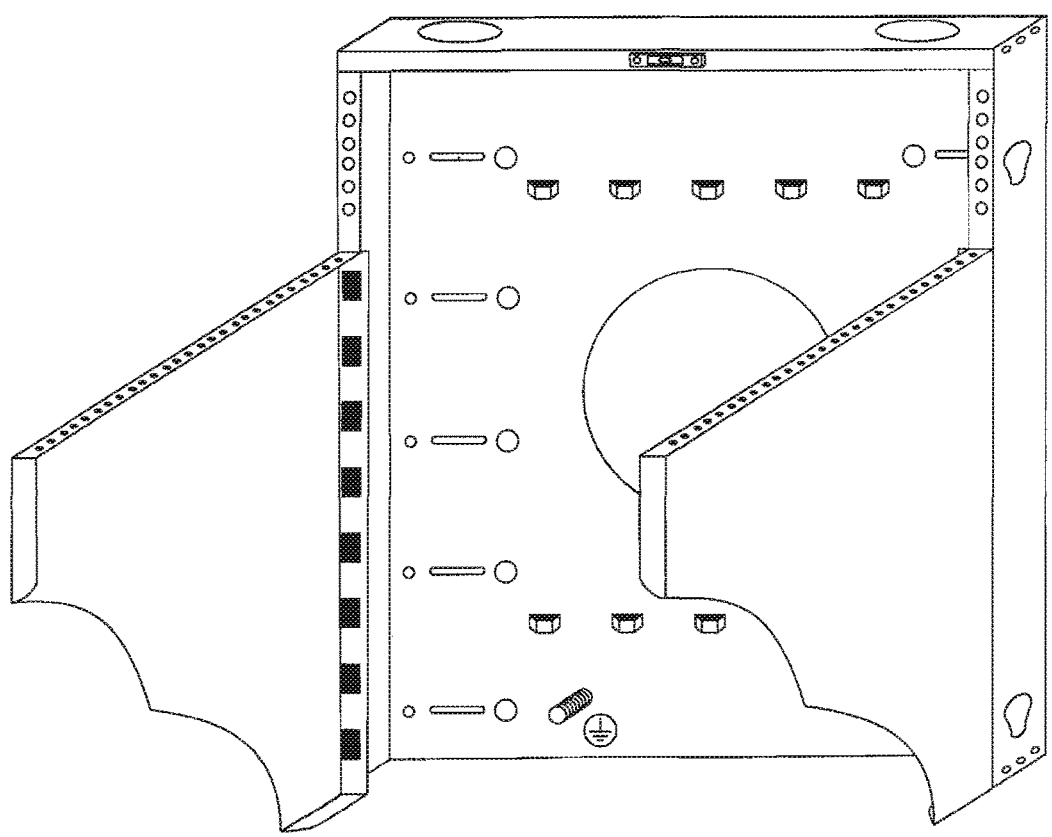
FIG. 10C is a perspective illustration showing our rack in "back-to-back" relationship, also illustrating how the components and the patch panels can be mounted on a rack by screws.

FIG. 10B is an illustration showing a side view of our rack in a "back-to-back" relationship. FIG. 10C is a perspective illustration showing our rack in "back-to-back" relationship, also illustrating how the components and the patch panels can be mounted on a rack by screws.

While the rack has been shown in a preferred embodiment, it would be obvious to one of ordinary skill in the art that variations and modifications can be made without departing from the spirit and scope of the invention. Various types of uninterruptible power supplies, automatic transfer switches, maintenance bypass panels, and various other power-related products, could be included. Changes to physical dimensions, increased power capability, alternative plugs and ports, and appropriate cord lengths can also be made. In addition, singular systems, such as a UPS with SNMP, can be configured. Additional modifications can include redundant UPSS, automatic transfer switches, power distribution units, and other ancillary equipment.

The invention claimed is:

1. A secure equipment rack for mounting at least one component having mounting ears substantially coplanar with a component front surface, the front surface having a height dimension, and a width dimension, the component having a depth dimension extending normal to the front surface of the component, said equipment rack comprising:
   A subcombination including:
   a back plate having a top, a bottom, and sides, said back plate capable of being mounted to a substantially vertical surface, said back plate capable of having brackets mounted thereto;
   two brackets each having a top and a bottom, and each capable of being mounted to said back plate, each of said brackets, when mounted to said back plate, having a horizontal dimension extending substantially normal to said back plate, said horizontal dimension being 10U or less, said brackets for supporting said at least one component with said height dimension substantially parallel to said horizontal dimension;
   a horizontal fan assembly for mounting to the bottom of said brackets;
   a front cover for mounting to said subcombination for covering at least the front of said fan assembly and said brackets by fasteners;
   a top cover for covering at least the top of said subcombination; and
   a locking mechanism for locking said top cover to said front cover.

2. The secure equipment rack of claim 1 wherein said substantially vertical surface is a two-post rack.

3. The secure equipment rack of claim 1 wherein said substantially vertical surface is a wall.

4. The secure equipment rack of claim 1 further including cable management bridge lances on said back plate for dressing and tying down cables.

5. The secure equipment rack of claim 1 wherein the back plate includes an additional 2U or less of mounting space oriented substantially normal to the support surface of the two brackets.

6. The secure equipment rack of claim 1 including a built-in level.

7. The secure equipment rack of claim 6 wherein said built-in level is on said back plate.

8. The secure equipment rack of claim 1 including a grounding stud.

9. The secure equipment rack of claim 8 wherein said grounding stud is on said back plate.

10. The secure equipment rack of claim 1 wherein said back plate includes slots for allowing said back plate to be secured to wood surfaces by fasteners.

11. The secure equipment rack of claim 1 wherein said back plate includes holes for allowing mounting to a shallow wall by toggle bolts.

12. The secure equipment rack of claim 1 wherein said back plate includes holes for allowing said back plate to be mounted on a two-post rack by fasteners.

13. The secure equipment rack of claim 1 wherein said brackets include tabs and said back plate included cutouts, and said brackets are attachable to said back plate by nesting said tabs in said cutouts.

14. The equipment rack of claim 1 wherein said back plate is capable of having at least one second component mounted thereto substantially perpendicularly to said at least one component.

15. A secure equipment rack for mounting at least one component having mounting ears substantially coplanar with a component front surface, the front surface having a height dimension, and a width dimension, the component having a depth dimension extending normal to the front surface of the component, said secure equipment rack comprising:

A subcombination including:
a back plate having a top, a bottom, and sides, said back plate capable of being mounted to a substantially vertical surface, said back plate capable of having brackets mounted thereto;
two brackets each capable of being mounted to said back plate, each of said brackets having a surface oriented as a top surface when mounted to said back plate, the top surface having a horizontal dimension extending normal to said substantially vertical surface, said horizontal dimension being 10U or less, the combination of said two brackets when mounted to said back plate capable of having mounted thereto said component oriented with said height dimension substantially parallel to said horizontal dimension of said top surface;
a front cover for mounting to said subcombination for covering at least the front of a fan assembly and said brackets by fasteners;
a top cover for covering at least the top of said subcombination; and
a locking mechanism for locking said top cover to said front cover.

16. The equipment rack of claim 15 wherein said back plate is capable of having at least one second component mounted thereto substantially perpendicularly to said at least one component.

17. A secure equipment rack capable of being mounted in back-to-back relationship with another secure equipment rack, each of said racks for mounting at least one component having mounting ears substantially coplanar with a component front surface, the front surface having a height dimension, and a width dimension, the component having a depth dimension extending normal to the front surface of the component,
wherein each of said secure equipment racks comprises a subcombination including
(i) a back plate mountable on a substantially vertical surface, said back plate having a top, a bottom and sides, said back plate capable of having brackets mounted thereto, and (ii) two brackets each capable of being mounted to said back plate, each of said brackets having a surface oriented as a top surface when mounted to said back plate, the top surface having a horizontal dimension extending normal to said substantially vertical surface, said horizontal dimension being 10U or less,
the combination of said two brackets, when said brackets are mounted to said back plate, capable of having mounted thereto said at least one component oriented with said height dimension substantially parallel to said horizontal dimension of said top surface;
a front cover for mounting to said subcombination for covering at least the front of a fan assembly and said brackets by fasteners;
a top cover for covering at least the top of said subcombination; and
a locking mechanism for locking said top cover to said front cover.

18. The combination of two secure equipment racks of claim 17 mounted to a rack in back-to-back relationship.

19. A secure equipment rack capable of being mounted in back-to-back relationship to each other, each of said racks for mounting at least one component having mounting ears substantially coplanar with a component front surface, the front surface having a height dimension, and a width dimension, the component having a depth dimension extending normal to the front surface of the component,
wherein each of said secure equipment racks comprises a subcombination including
(i) a back plate capable of being mounted to a substantially vertical surface, said back plate having a top, a bottom and sides, said back plate capable of having brackets mounted thereto, and
(ii) two brackets each capable of being mounted to said back plate,
each of said brackets, when mounted to said back plate, having a horizontal dimension extending substantially normal to said back plate, said horizontal dimension being 10U or less for supporting said at least one component with said height dimension substantially parallel to said horizontal dimension;
a fan assembly for mounting to the bottom of said brackets;
a front cover for mounting to said subcombination for covering at least the front of said fan assembly and said brackets by fasteners;
a top cover for covering at least the top of said subcombination; and
a locking mechanism for locking said top cover to said front cover.

20. The combination of two secure equipment racks of claim 19 mounted to a rack in back-to-back relationship.

21. A secure equipment rack for mounting at least one component having mounting ears substantially coplanar with a component front surface, the front surface having a height dimension, and a width dimension, the component having a depth dimension extending normal to the front surface of the component, said equipment rack comprising:

A subcombination including a back plate having a top, a bottom and sides, said back plate capable of being mounted to a substantially vertical surface; and two brackets each mounted to said back plate, each of said brackets having a horizontal dimension extending substantially normal to said back plate, said horizontal dimension being 10U or less, for supporting said at least one component with said height dimension substantially parallel to said horizontal dimension;

a fan for mounting to the bottom of said brackets;

a front cover for mounting to said subcombination for covering at least the front of said fan assembly and said brackets by fasteners;

a top cover for covering at least the top of said subcombination; and a locking mechanism for locking said top cover to said front cover.

22. The equipment rack of claim 21 wherein said back plate is capable of having at least one second component mounted thereto substantially perpendicularly to said at least one component.

23. Two secure equipment racks mounted to the same substantially vertical surface in back-to-back relationship to each other, each of said racks for mounting at least one component having mounting ears substantially coplanar with a component front surface, the front surface having a height dimension, and a width dimension, the component having a depth dimension extending normal to the front surface of the component, each of said equipment racks comprising A subcombination including (i) a back plate having a top, a bottom and sides, said back plate mounted to said substantially vertical surface, and (ii) two brackets each mounted to said back plate, each of said brackets having a horizontal dimension extending substantially normal to said back plate, said horizontal dimension being 10U or less for supporting said at least one component with said height dimension substantially parallel to said horizontal dimension;

a fan assembly for mounting to the bottom of said brackets;

a front cover for mounting to said subcombination for covering at least the front of said fan assembly and said brackets by fasteners;

a top cover for covering at least the top of said subcombination; and a locking mechanism for locking said top cover to said front cover.

24. A secure equipment rack capable of being mounted in back-to-back relationship to each other, each of said racks for mounting at least one component having mounting ears substantially coplanar with a component front surface, the front surface having a height dimension, and a width dimension, the component having a depth dimension extending normal to the front surface of the component, wherein each of said secure equipment racks comprises a subcombination including (i) a back plate capable of being mounted to a substantially vertical surface, said back plate having a top, a bottom and sides, said back plate capable of having brackets mounted thereto, and (ii) two brackets each capable of being mounted to said back plate, each of said brackets, when mounted to said back plate, having a horizontal dimension extending substantially normal to said back plate, said horizontal dimension being 10U or less for supporting said at least one component with said height dimension substantially parallel to said horizontal dimension;

a fan assembly for mounting to the bottom of said brackets;

a front panel and a top cover, said front panel and top cover fixedly mounted in swinging relationship, for fixedly covering said subcombination, and for opening to allow access to said at least one component.

25. A method of providing a secure equipment rack for mounting at least one component having mounting ears substantially coplanar with a component front surface, the front surface having a height dimension, and a width dimension, the component having a depth dimension extending normal to the front surface of the component, said method comprising:

providing a back plate having a top, a bottom and sides, said back plate capable of being mounted to a substantially vertical surface; and providing two brackets capable of being mounted to said back plate, each of said brackets having a horizontal dimension extending substantially normal to said back plate, said horizontal dimension being 10U or less, for supporting said at least one component vertically with said height dimension substantially parallel to said horizontal dimension;

wherein said brackets having a fan mounted to the bottom of said brackets;

a front cover mounted to said back plate and brackets by fasteners, for covering at least the front of said fan assembly and said brackets;

a top cover for covering at least the top of said back plate and said brackets; and a locking mechanism for locking said top cover to said front cover.

26. A secure equipment rack for mounting at least one component having mounting ears substantially coplanar with a component front surface, the front surface having a height dimension, and a width dimension, the component having a depth dimension extending normal to the front surface of the component, said equipment rack comprising:

A subcombination including a back plate having a top, a bottom and sides, said back plate capable of being mounted to a substantially vertical surface; and two brackets each mounted to said back plate, each of said brackets having a horizontal dimension extending substantially normal to said back plate, said horizontal dimension being 10U or less, for supporting said at least one component vertically with said height dimension substantially parallel to said horizontal dimension;

a fan for mounting to the bottom of said brackets;

a front cover for mounting to said subcombination for covering at least the front of said fan assembly and said brackets by fasteners;

a top cover for covering at least the top of said subcombination; and a locking mechanism for locking said top cover to said front cover.

27. A secure equipment rack for mounting at least one component having mounting ears substantially coplanar with a component front surface, the front surface having a height dimension, and a width dimension, the component having a depth dimension extending normal to the front surface of the component, said equipment rack comprising:

a back plate having a top, a bottom, and sides, said back plate capable of being mounted to a wall, said back plate capable of having brackets mounted at substantially right angles to said back plate and said wall;

two brackets each having a top and a bottom, each of said brackets capable of being mounted to said back plate at substantially right angles to said back plate and to said wall, each of said brackets, when mounted to said back plate, having a horizontal dimension extending substantially normal to said back plate, said horizontal dimension being 10U or less, for supporting said at least one component with said height dimension substantially parallel to said horizontal dimension;

a fan assembly for mounting to the bottom of said brackets;

a front cover for mounting to said rack for covering at least the front of said fan assembly and said brackets by fasteners;

a top cover for covering at least the top of said rack; and a locking mechanism for locking said top cover to said front cover.

* * * * *